United States Patent
Urano

(10) Patent No.: US 8,518,804 B2
(45) Date of Patent: Aug. 27, 2013

(54) SEMICONDUCTOR DEVICE MANUFACTURING METHOD AND MANUFACTURING APPARATUS

(75) Inventor: Yuichi Urano, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 55 days.

(21) Appl. No.: 13/278,164

(22) Filed: Oct. 20, 2011

(65) Prior Publication Data

US 2012/0100639 A1    Apr. 26, 2012

(30) Foreign Application Priority Data

Oct. 21, 2010   (JP) .................................. 2010-236205

(51) Int. Cl.
    *H01L 21/301*    (2006.01)
    *H01L 21/46*     (2006.01)
    *H01L 21/78*     (2006.01)

(52) U.S. Cl.
    USPC .................... 438/463; 438/457; 257/E21.238

(58) Field of Classification Search
    USPC .......... 438/455, 457, 464, 463; 257/E21.238
    See application file for complete search history.

(56) References Cited

U.S. PATENT DOCUMENTS

| | | | |
|---|---|---|---|
| 4,728,417 A | 3/1988 | Aldag, Jr. et al. | |
| 7,947,586 B2 * | 5/2011 | Urano ........................... | 438/584 |
| 2004/0180515 A1 | 9/2004 | Okawa | |
| 2008/0293221 A1 | 11/2008 | Yamamoto et al. | |

FOREIGN PATENT DOCUMENTS

| JP | 63-030591 A | 2/1988 |
|---|---|---|
| JP | 04-225574 A | 8/1992 |
| JP | 06-224397 A | 8/1994 |
| JP | 2002-170866 A | 6/2002 |
| JP | 2003-297786 A | 10/2003 |
| JP | 2004-281430 A | 10/2004 |
| JP | 2008-294287 A | 12/2008 |

* cited by examiner

*Primary Examiner* — Hoai V Pham
(74) *Attorney, Agent, or Firm* — Rabin & Berdo, P.C.

(57) ABSTRACT

A semiconductor device manufacturing method and manufacturing apparatus with which it is possible, when a wafer has a warp, to effectively peel off an ultraviolet peelable tape with ultraviolet irradiation of a short duration. Even when a wafer has a warp, by correcting the warp of the wafer with an ultraviolet transmitting plate, and uniformly irradiating an ultraviolet peelable tape attached to the wafer with ultraviolet light, it is possible to reduce a distance between an ultraviolet light source and the ultraviolet peelable tape. Also, by blocking heat from the ultraviolet light source with the ultraviolet transmitting plate, it is possible to suppress a rise in temperature of the wafer. As a result of this, it is possible to effectively peel the ultraviolet peelable tape from the wafer with ultraviolet irradiation of a short duration without any adhesive residue remaining.

7 Claims, 24 Drawing Sheets

FIG. 8
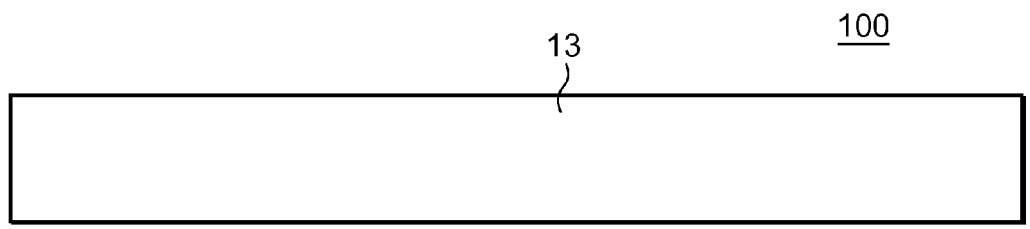
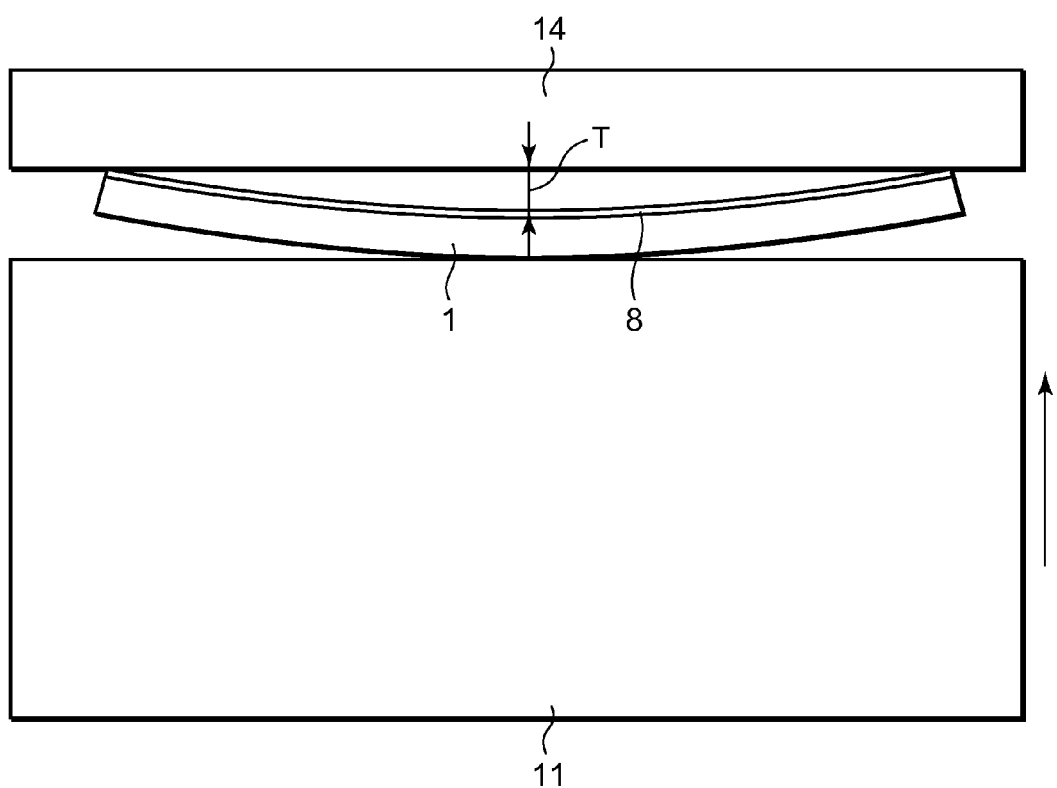

SEMICONDUCTOR DEVICE MANUFACTURING METHOD AND MANUFACTURING APPARATUS

CROSS REFERENCE TO RELATED APPLICATION

The entire disclosure of the inventor's corresponding Japanese patent application, Ser. No. JP PA 2010-236205, filed Oct. 21, 2010, is hereby incorporated by reference.

BACKGROUND OF THE INVENTION

1. Technical Field

The present invention relates to a manufacturing method of a semiconductor device formed from a thin semiconductor wafer, such as a field stop (FS) insulated gate bipolar transistor (IGBT), and to a manufacturing apparatus thereof.

2. Related Art

Among manufacturing steps of a semiconductor device formed from a thin silicon wafer (hereafter simply called a wafer), such as an FS IGBT, after a surface structure of a semiconductor element is made on the upper surface of the wafer, there is a step of grinding the rear surface of the wafer, thus carrying out a reduction in film thickness (hereafter simply called "a reduction in thickness"). In the wafer rear surface grinding step, after a grinding protection tape, which is a surface protection tape which protects the upper surface of the wafer, is attached to the upper surface of the wafer (the upper surface of the surface structure), the rear surface of the wafer is ground to a desired thickness using a rear surface grinding apparatus. This grinding step is also called a back-grinding step. After the grinding is finished, the grinding protection tape is peeled from the upper surface of the wafer using a peeling tape.

In order to make it easier to peel the grinding protection tape from the upper surface of the wafer, a method of lowering the adhesion itself of the grinding protection tape is proposed. This is because it is necessary to prevent the wafer from being damaged when peeling the grinding protection tape from the wafer reduced in thickness.

Also, for example, in JP-A-2004-281430, it is disclosed that a wafer is held by a dicing tape (an adhesive tape), and a member supporting the lower surface of the dicing tape is provided so that the dicing tape will not go slack due to an ultraviolet irradiation for peeling, that the supporting member is configured of a material (glass or plastic) which transmits ultraviolet light, that the ultraviolet light is transmitted through the supporting member, and the dicing tape is irradiated with the ultraviolet light, and the like.

Also, in JP-A-6-224397, it is described that an ultraviolet (UV) irradiation curable tape (an ultraviolet peelable tape) is used as a surface protection tape, and it is possible to easily peel off the surface protection tape by irradiating the surface protection tape with ultraviolet light, and thereby weakening the adhesion thereof.

As another method, for example, in JA-P-4-225684, a semiconductor device manufacturing method is proposed whereby a light transmissive ultraviolet (UV) tape coated with an adhesive having the property of being reduced in adhesion when irradiated with ultraviolet light is attached to one surface of a wafer, and a thin portion is formed in the wafer.

Also, for example, in JP-A-63-30591, as a tape whose adhesion is reduced by ultraviolet light, an ultraviolet curable foam tape is also described, apart from the previously described ultraviolet irradiation curable tape.

In recent years, a use of an ultraviolet peelable tape in a wet etching, plate processing step, or the like, other than the rear surface grinding step, in order to protect an electrode surface formed on a wafer has been prevalent, and an ultraviolet peelable tape with higher adhesion has been developed. With this ultraviolet peelable tape, as the adhesion thereof is high, an ultraviolet irradiation amount necessary for peeling is ten times or more larger compared with that of an ultraviolet peelable tape used as the heretofore known grinding protection tape, and specifically, an ultraviolet irradiation amount of 1000 to 3000 $mJ/cm^2$ is necessary for peeling.

FIGS. 14 to 22 are main portion manufacturing step sectional views showing a heretofore known semiconductor manufacturing method in the order of steps. Herein, a planar field stop (FS) IGBT shown in FIG. 24 is taken up as a semiconductor device. FIG. 24, being an enlarged view of a portion A of FIG. 22, is a main portion configuration diagram of a cell of the FS IGBT. In FIG. 24, reference numeral 51 is an n-type silicon substrate, 52 a p-well layer, 53 an n-emitter layer, 54 a gate insulating film, 55 a gate electrode, 56 an emitter electrode, 57 an interlayer insulating film, 58 an n-FS layer, 59 a p-collector layer, 60 a collector electrode, and 61 a surface structure.

Firstly, the surface structure 61 configured of the p-well layer 52, n-emitter layer 53, gate insulating film 54, gate electrode 55, emitter electrode 56, interlayer insulating film 57, and an unshown surface protection film (a polyimide film) covering a portion, other than the emitter electrode 56, electrically connected to the exterior is formed on the surface layer of an n-type wafer 1 (FIG. 14). The emitter electrode 56 at this stage is an aluminum electrode formed from an aluminum-silicon (AlSi) film 3.

Next, the surface structure 61 is attached to a grinding protection tape 2 (a backgrinding tape), and a rear surface 1a of the wafer 1 is ground, reducing the thickness of the wafer 1 (FIG. 15). The thickness of the wafer 1 is in the order of 80 μm for a product with a breakdown voltage of 600V, and in the order of 140 μm for a product with a breakdown voltage of 1200V.

Next, the grinding protection tape 2 is peeled off, an ion implantation of phosphorus, and an ion implantation of boron, into the ground rear surface 1a are carried out, and a thermal treatment is carried out, forming the n-field stop (FS) layer 58 and p-collector layer 59 (FIG. 16). The FS layer 58 is also called a buffer layer.

Next, an aluminum-silicon (AlSi) film 4, a titanium (Ti) film 5, a nickel (Ni) film 6, and a gold (Au) film 7 are deposited by sputtering on the p-collector layer 59, forming the collector electrode 60 which is a rear surface electrode (FIG. 17). At this stage, the rear surface side of the wafer 1 is curved in a concave form by the stress of the collector electrode 60. With a six inch wafer, a warp T thereof is up to as many as a dozen millimeters or so. The upper side of FIG. 17 is an enlarged view of a chip portion, and the lower side is a diagram showing the whole of the wafer 1 in such a way that the warp T of the wafer 1 can be seen.

Next, an ultraviolet peelable tape 8 is attached as a surface projection tape to the gold film 7 formed on the wafer rear surface 1a (FIG. 18). The warp is maintained even after the ultraviolet peelable tape 8 has been attached. As the ultraviolet peelable tape 8, there is an ultraviolet irradiation curable tape, an ultraviolet curable foam tape, or the like.

Next, an electroless nickel and substituent gold plating process is performed on the emitter electrode 56 (on the aluminum-silicon film 3) which is the surface structure 61 of the wafer 1, and a nickel film 9 and gold film 10 are formed deposited on the aluminum-silicon film 3 (FIG. 19). At this stage, the emitter electrode 56 is configured of the aluminum-silicon film 3, nickel film 9, and gold film 10. The rear surface 1a side of the wafer 1 is of a concave form after this step has finished, and in the case of a six inch wafer, the warp T is 2 mm to a dozen millimeters or so. Also, in the plating process, the collector electrode 60 formed on the rear surface 1a of the wafer 1 is protected by the ultraviolet peelable tape 8.

When an ultraviolet curable foam tape is used as the ultraviolet peelable tape 8, a foaming agent which generates a nitrogen gas in response to ultraviolet light 12 is contained in the ultraviolet peelable tape 8. In the electroless nickel plating process, as a strong alkaline solution with a pH of 12 or more and a strong acid with a pH of 1 or less are used as a pretreatment solution, a strong adhesion to the gold film 7 (the surface film of the collector electrode 60) is required of the ultraviolet peelable tape 8.

However, when the adhesion of the adhesive layer is increased, an ultraviolet irradiation amount of 1000 to 3000 mJ/cm$^2$ is necessary for peeling after the plating process. This ultraviolet irradiation amount is ten times or more larger compared with the ultraviolet irradiation amount when using an ultraviolet peelable tape as the backgrinding tape (grinding protection tape 2), as heretofore described.

Next, with the wafer 1 placed on a support 11 with the surface structure 61 of the wafer 1 downward, and the ultraviolet peelable tape 8 in close contact with the wafer rear surface 1a upward, the ultraviolet peelable tape 8 in close contact with the warped wafer rear surface 1a is irradiated with the ultraviolet light 12 (FIG. 20).

Next, the ultraviolet peelable tape 8 in close contact with the rear surface 1a of the wafer 1 is peeled off (FIG. 21).

Subsequently, the wafer 1 is cut along dicing lines 17, forming chips 18 (FIG. 22).

As shown in FIG. 20, the wafer 1 to be irradiated with the ultraviolet light 12 is reduced in thickness by the backgrinding, and the rear surface 1a side (the upper side of the drawing) of the wafer 1 is warped in a concave form by the stress of the electrode 60 formed on the wafer 1. In the case of a six inch wafer, as the warp T is in the order of a dozen millimeters or so when it is large, the distance from the ultraviolet light source 13 to the wafer 1 changes in the plane of the wafer 1, and the ultraviolet illuminance varies in the plane of the wafer 1.

When a mercury lamp or a metal halide lamp is used as the ultraviolet light source 13, an ultraviolet illuminance of 30 to 100 mW/cm$^2$ is easily obtained but, at the same time, the temperature of the wafer 1 rises to 100° C. or more in several seconds due to heat from the ultraviolet light source 13, and it may happen that an acrylic adhesive of the ultraviolet peelable tape 8 is altered, and a residue thereof remains on the peeled surface (rear surface 1a) of the wafer 1. In particular, the smaller the thickness of the wafer 1, the smaller the heat capacity of the wafer 1, meaning that the rise in temperature increases, a residue is more likely to remain, and a poor appearance occurs due to the residue.

FIG. 23 is a diagram showing the dependence of a wafer temperature on an irradiation time when using a metal halide lamp. A wafer 1, with a thickness of the order of 140 μm, placed on the support 11 is irradiated with the ultraviolet light 12 from above. A distance Lo between the metal halide lamp, which is the ultraviolet light source 13, and the wafer 1 is about 300 mm. The wavelength of the metal halide lamp at this time is 365 nm, and the ultraviolet illuminance is in the order of about 15 mW/cm$^2$. The wafer temperature reaches 110° C., which exceeds the approximately 80° C. resistible temperature of the ultraviolet peelable tape 8, in an irradiation time of the order of 20 seconds. However, the ultraviolet irradiation amount at this time is 300 mJ/cm$^2$, which is one third or less of the ultraviolet irradiation amount (1000 mJ/cm$^2$) necessary for peeling.

Meanwhile, when a fluorescent tube type black light or ultraviolet light emitting diode with little heat generation is used as the ultraviolet light source 13, it is possible to suppress the rise in temperature of the wafer 1, but as there is no little heat generation from the lamp itself, it is not possible to bring the wafer 1 into contact with, or close to, the lamp. For this reason, it is necessary for the wafer 1 to be spaced some distance away from the lamp. For example, when the distance Lo from the wafer 1 is 20 to 50 mm, the ultraviolet illuminance is reduced to several mW/cm$^2$. For this reason, there is a problem in that an irradiation time of several minutes to a dozen minutes or so is necessary in order to obtain an ultraviolet irradiation amount of 1000 mJ/cm$^2$ or more necessary for peeling, and a throughput (a manufacturing man-hour) decreases.

This point will be more specifically described.

It is generally known that a relationship between illuminance and luminosity is given by the following equation.

$$\text{Illuminance} = \text{luminosity}/(\text{distance})^2 \qquad \text{Expression 1}$$

It is understood from the above equation that, when the luminosity of the ultraviolet light source 13 is constant, the illuminance is reduced to one fourth when the distance from the ultraviolet light source 13 is increased twofold. The luminosity is luminous fluxes emitted from the ultraviolet light source 13 multiplied by area, and the illuminance is energy per unit time and unit area on a light receiving surface, which is represented by W/area. Also, an irradiation amount is energy per unit area on the light receiving surface, which is represented by J/area.

When a fluorescent tube type black light or an ultraviolet light emitting diode is used as the ultraviolet light source 13, as they have a low ultraviolet illuminance, it is necessary to reduce the distance Lo from the ultraviolet light source 13 to the wafer 1 in order to obtain the ultraviolet irradiation amount necessary for peeling.

A description will be given of a case in which, for example, a fluorescent tube type black light is used as the ultraviolet light source 13, the distance Lo is reduced to 20 mm in order to increase the ultraviolet illuminance, and the wafer 1 is warped 10 mm. In this case, the distance from the fluorescent tube type black light to a place (the peripheral end portion of the wafer 1) closest thereto is 10 mm, while the distance from the fluorescent tube type black light to a place (the bottom of the depressed portion) farthest therefrom is 20 mm. For this reason, the ultraviolet illuminance in the farthest place is one fourth of the ultraviolet illuminance in the closest place according to the previous equation. Meanwhile, as the distance can be reduced to 10 mm when the wafer 1 has no warp, when there is a warp, it is necessary that the irradiation time is made four times longer compared with when there is no warp. For this reason, when the wafer 1 has a warp, the throughput decreases, and a manufacturing cost increases.

Also, in JP-A-2004-281430 to JP-A-63-30591, it is not described that, when the wafer is originally warped, the warp is corrected, and the ultraviolet peelable tape is irradiated with the ultraviolet light, and peeled from the wafer.

As another method of correcting the warp of the wafer, a method is conceivable whereby the wafer is adsorbed by a porous chuck or an electrostatic chuck but, as it is also difficult in this case to adsorb the wafer without correcting the warp of the wafer at all, an auxiliary mechanism for correcting the warp of the wafer is necessary, meaning that there has been a problem in that a wafer support mechanism is complicated, increasing the cost.

SUMMARY OF THE INVENTION

An object of the invention is to provide a semiconductor device manufacturing method and manufacturing apparatus with which it is possible, when a wafer has a warp, to effectively peel off an ultraviolet peelable tape with ultraviolet irradiation of a short duration.

In order to achieve the object, according to a first aspect of the invention, a semiconductor device manufacturing method includes a step of clamping a semiconductor wafer between an ultraviolet transmitting plate disposed in such a way as to abut against a surface of the semiconductor wafer to which an ultraviolet peelable tape is attached, and a pressing member disposed in such a way as to abut against the other surface of the semiconductor wafer; a step of causing ultraviolet light to be transmitted through the ultraviolet transmitting plate and irradiating the ultraviolet peelable tape with the ultraviolet light; and a step of peeling the ultraviolet peelable tape from the semiconductor wafer.

According to a second aspect of the invention, it is preferable in the first aspect of the invention that the clamping step is a step of placing the semiconductor wafer on either the ultraviolet transmitting plate or pressing member, and clamping the semiconductor wafer by moving the ultraviolet transmitting plate and pressing member relative to each other.

Also, according to a third aspect of the invention, it is preferable in the first or second aspect of the invention that the clamping step is a step of correcting a warp of the semiconductor wafer by clamping the semiconductor wafer between the ultraviolet transmitting plate and pressing member.

Also, according to a fourth aspect of the invention, it is preferable in any one of the first to third aspects of the invention that the thickness of the semiconductor wafer is 80 μm or more to 140 μm or less.

Also, according to a fifth aspect of the invention, it is preferable in the first aspect of the invention that the ultraviolet light irradiation step is a step of irradiating the ultraviolet peelable tape with 1000 mJ/cm² or more of ultraviolet light.

Also, according to a sixth aspect of the invention, a semiconductor device manufacturing apparatus includes an ultraviolet light source which irradiates an ultraviolet peelable tape with ultraviolet light; a support on which is placed a semiconductor wafer to which the ultraviolet peelable tape is attached; a correcting member which, being disposed opposed to the support, corrects a warp of the semiconductor wafer; and a mechanism which moves the support and correcting member relative to each other.

Also, according to a seventh aspect of the invention, it is preferable in the sixth aspect of the invention that one of the correcting member and the support supporting the semiconductor wafer, against which the ultraviolet peelable tape attached to the semiconductor wafer abuts, is configured of an ultraviolet transmitting plate, and disposed in such a way that the ultraviolet peelable tape can be irradiated with ultraviolet light from the ultraviolet light source, via the ultraviolet transmitting plate.

Also, according to an eighth aspect of the invention, it is preferable in the seventh aspect of the invention that an infrared cut filter is disposed between the ultraviolet light source and ultraviolet transmitting plate.

Also, according to a ninth aspect of the invention, it is preferable in any one of the sixth to eighth aspects of the invention that the ultraviolet light source is a fluorescent tube type black light, a metal halide lamp, an ultraviolet light emitting diode, or a mercury lamp.

Also, according to a tenth aspect of the invention, it is preferable in any one of the sixth to eighth aspects of the invention that the ultraviolet transmitting plate is a heat-resistant glass plate which transmits the ultraviolet light.

According to the invention, even when a wafer has a warp, by irradiating the wafer with ultraviolet light after correcting the warp of the wafer in advance, it is possible to approximately uniformly irradiate an ultraviolet peelable tape attached to the wafer with the ultraviolet light. Also, it is possible to obtain a sufficient ultraviolet irradiation amount appropriate for peeling off the ultraviolet peelable tape, and achieve a reduction in irradiation time.

BRIEF DESCRIPTION OF THE DRAWINGS

FIG. 8 is a main portion manufacturing step sectional view, following FIG. 7, of the semiconductor device of the first working example of the invention;

DESCRIPTION OF THE PREFERRED EMBODIMENT(S)

Figure 1:
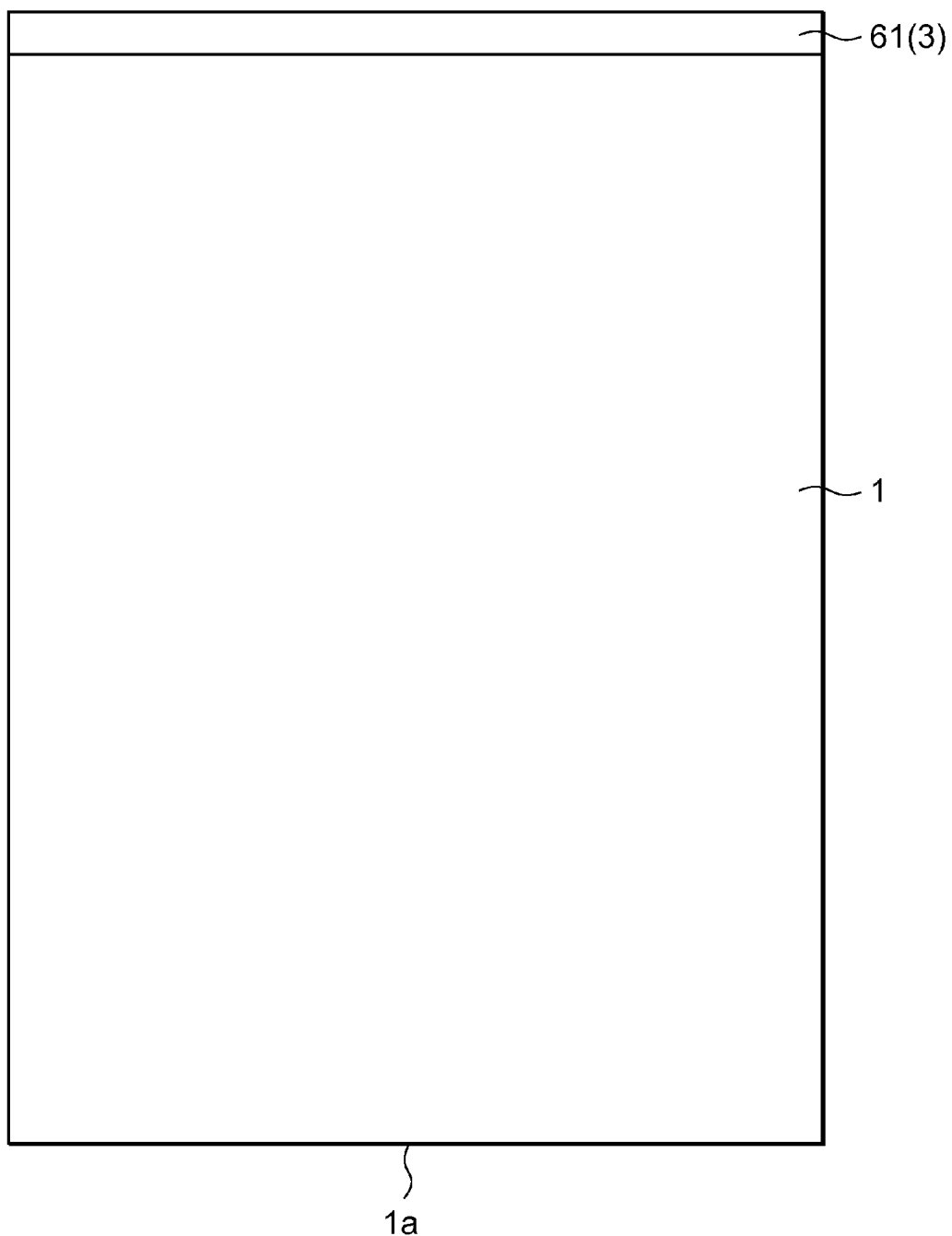
FIG. 1 is a main portion manufacturing step sectional view of a semiconductor device of a first working example of the invention.

An embodiment will be described using the following working examples. Portions identical to those of the heretofore known example are given identical reference numerals and characters.

WORKING EXAMPLE 1

FIGS. 1 to 11 are main portion manufacturing step sectional views showing in the order of steps a semiconductor device manufacturing method of a first working example of the invention. Herein, a planar field stop (FS) IGBT formed on a thin silicon wafer 1 is taken up as a semiconductor device.

Figure 24:
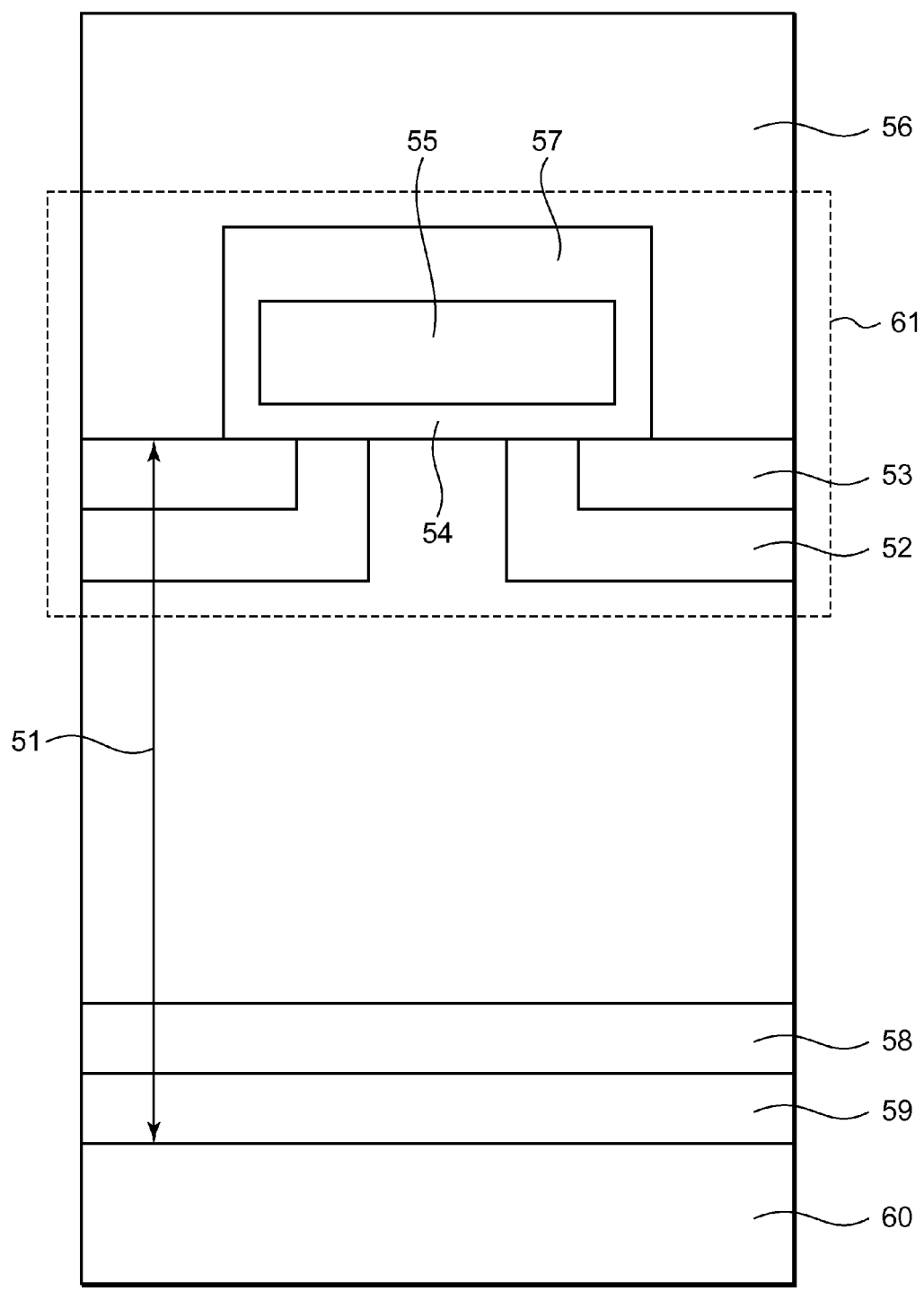
FIG. 24, being an enlarged view of a portion A of FIG. 22, is a main portion configuration diagram of a cell of an FS IGBT.

Firstly, a surface structure 61 configured of a p-well layer 52, an n-emitter layer 53, a gate electrode 55, an emitter electrode 56, and an interlayer insulating film 57, shown in FIG. 24, is formed on a surface layer of the n-type wafer 1 (FIG. 1). None of the portions configuring the surface structure 61 is shown in FIG. 1. Also, at this stage, the emitter electrode 56 of FIG. 24 is formed from an aluminum-silicon film 3.

Figure 2:
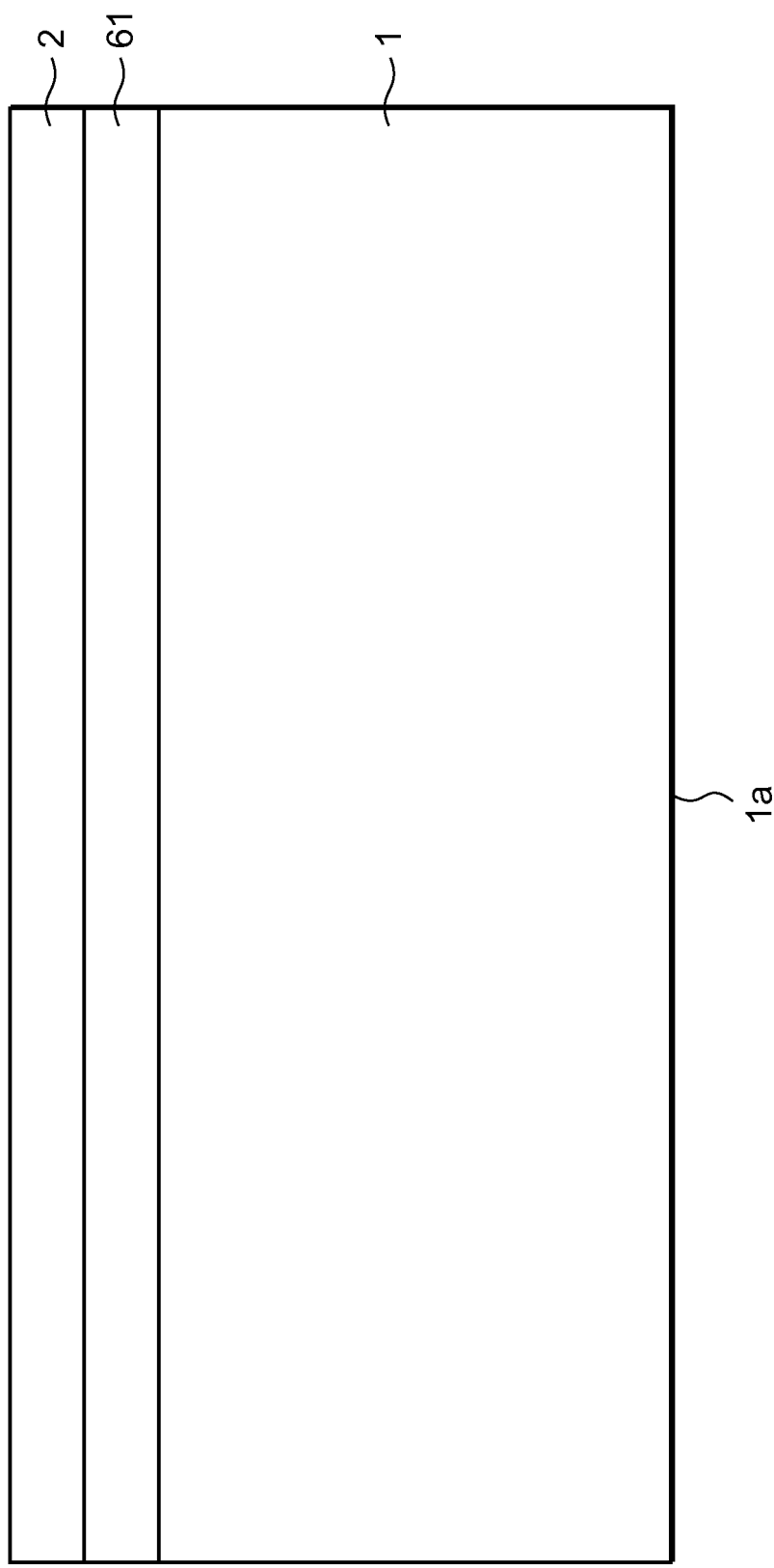
FIG. 2 is a main portion manufacturing step sectional view, following FIG. 1, of the semiconductor device of the first working example of the invention.

Next, the surface structure 61 is attached to a grinding protection tape 2 (a backgrinding tape), and a wafer rear surface 1a is ground, reducing the thickness of the wafer 1 (FIG. 2). The thickness of the wafer 1 is in the order of 80 μm for a product with a breakdown voltage of 600V, and in the order of 140 μm for a product with a breakdown voltage of 1200V.

Figure 3:
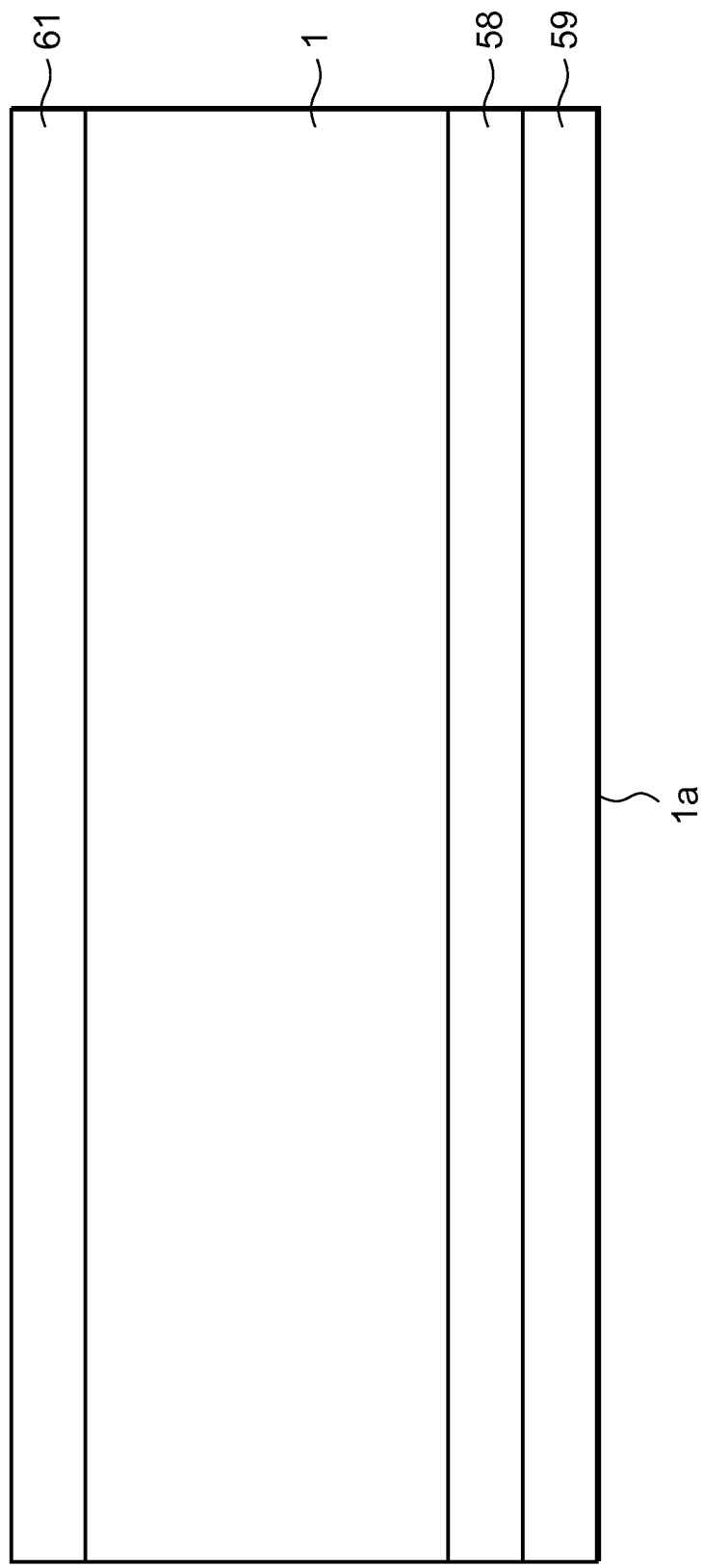
FIG. 3 is a main portion manufacturing step sectional view, following FIG. 2, of the semiconductor device of the first working example of the invention.

Next, the grinding protection tape 2 is peeled off, an ion implantation of phosphorus, and an ion implantation of boron, into the ground rear surface 1a are carried out, and a thermal treatment is carried out, forming an n-FS layer 58 and a p-collector layer 59 (FIG. 3).

Figure 4:
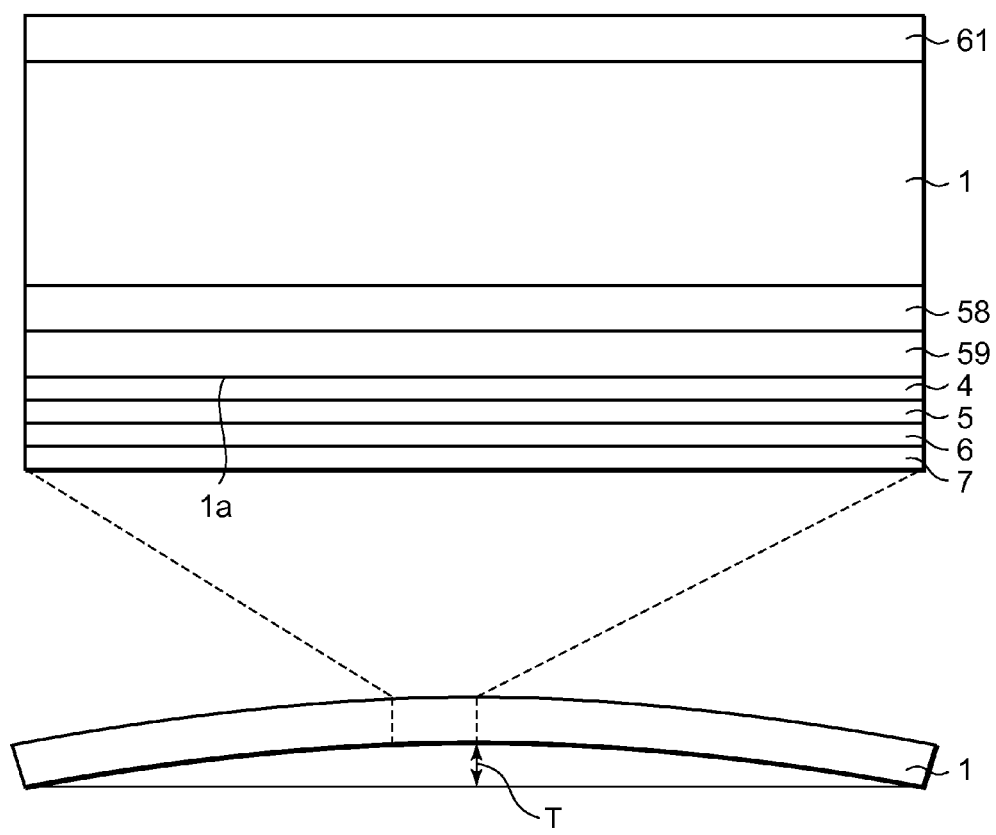
FIG. 4 is a main portion manufacturing step sectional view, following FIG. 3, of the semiconductor device of the first working example of the invention.

Next, an aluminum-silicon (AlSi) film 4, a titanium (Ti) film 5, a nickel (Ni) film 6, and a gold (Au) film 7 are deposited by sputtering on the p-collector layer 59, forming a collector electrode 60 (FIG. 4). The film thickness of each layer is, for example, such that the aluminum-silicon film 4 is 0.5 μm thick, the titanium film 5 is 0.25 μm thick, the nickel film 6 is 0.7 μm thick, and the gold film 7 is 0.1 μm thick. At this stage, the rear surface 1a side of the wafer 1 is curved (warped) in a concave form by the stress of the collector electrode 60. With a six inch wafer, a warp T thereof is up to a dozen millimeters or so.

Figure 5:
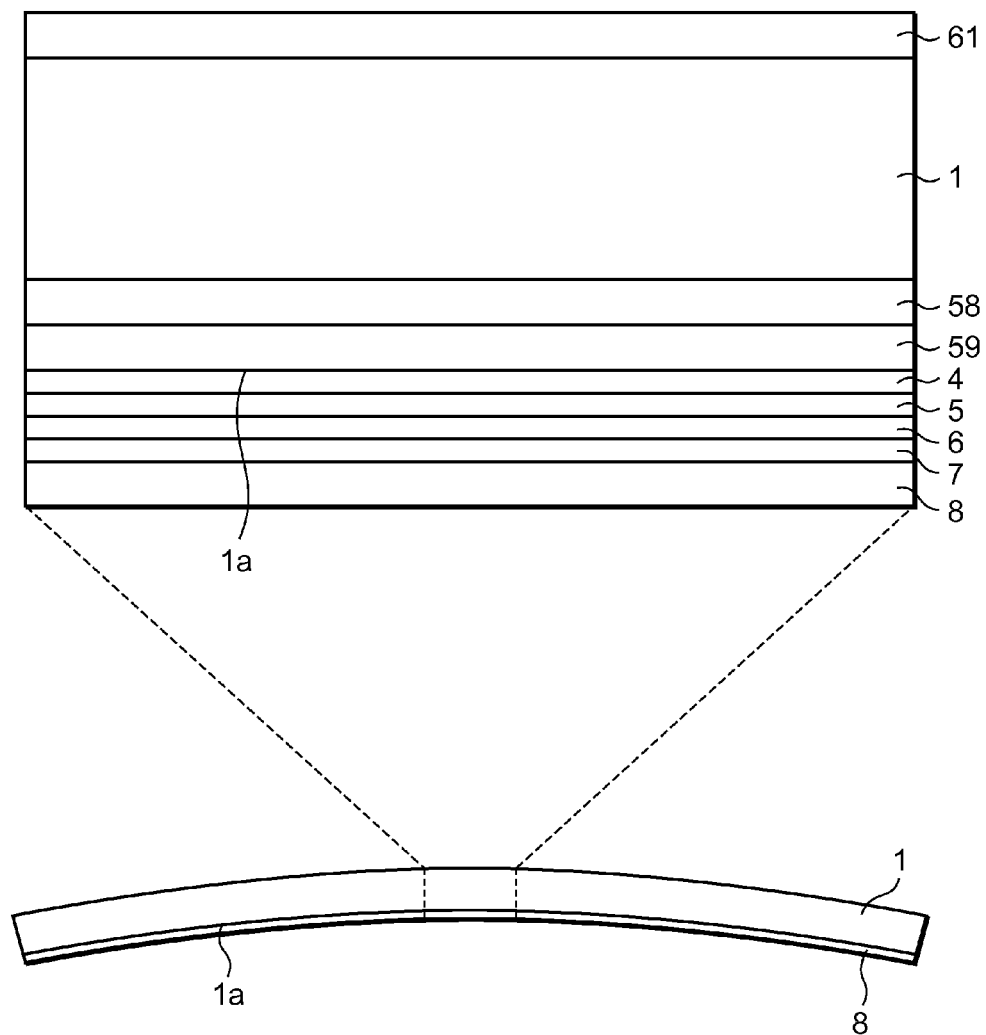
FIG. 5 is a main portion manufacturing step sectional view, following FIG. 4, of the semiconductor device of the first working example of the invention.

Next, an ultraviolet peelable tape 8 is attached as a surface protection tape to the gold film 7 formed on the wafer rear surface 1a (FIG. 5). The warp T is maintained even after the ultraviolet peelable tape 8 has been attached. As the ultraviolet peelable tape 8, there is an ultraviolet irradiation curable tape or an ultraviolet curable foam tape.

Figure 6:
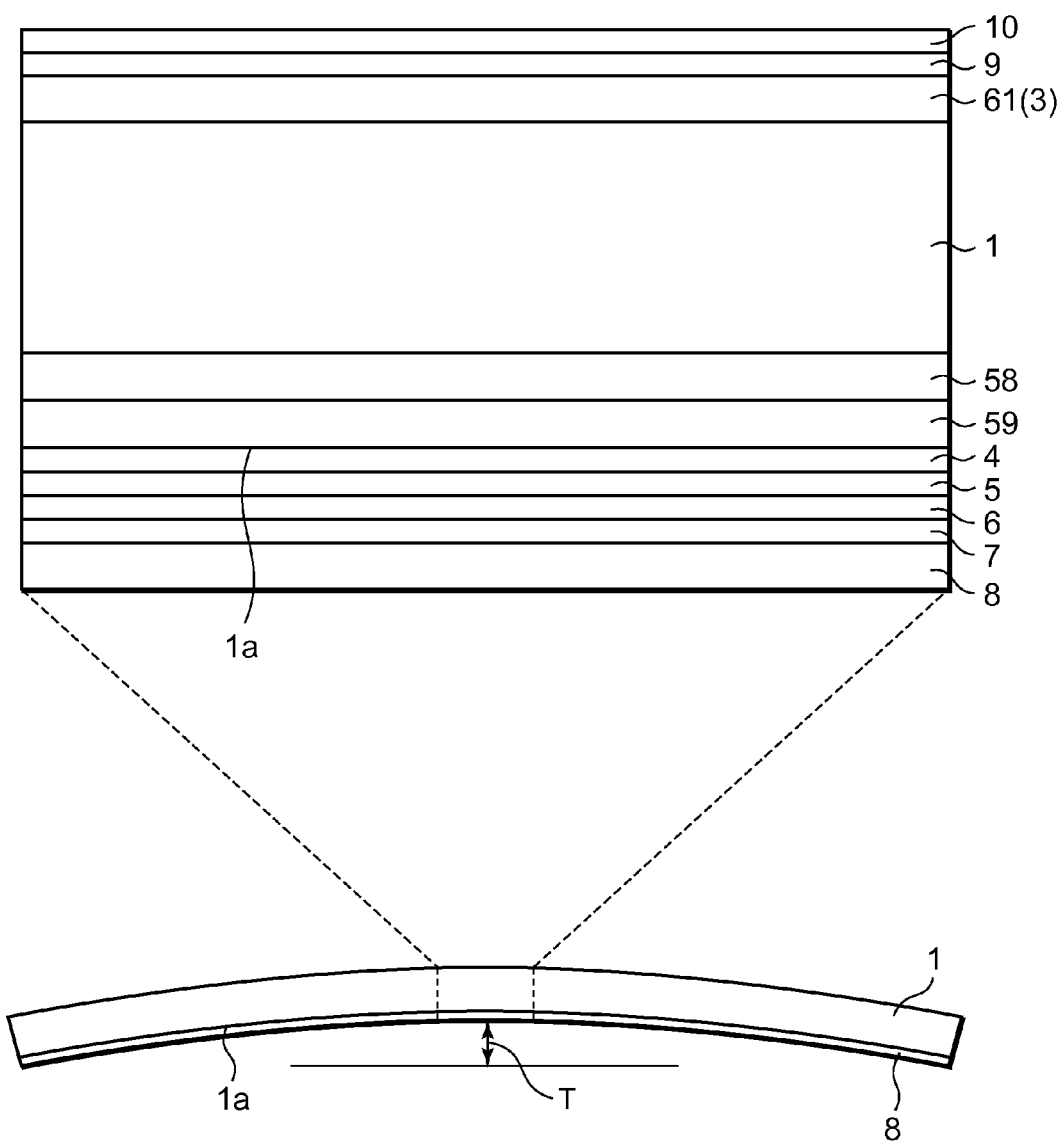
FIG. 6 is a main portion manufacturing step sectional view, following FIG. 5, of the semiconductor device of the first working example of the invention.

Next, a nickel film 9 and gold film 10 are formed and deposited on the emitter electrode 56, which is the surface structure 61 of the wafer 1, by an electroless nickel and substituent gold plating process (FIG. 6). The film thickness of each layer is, for example, such that the electroless nickel plated layer is 5 μm thick, and the substituent gold plated layer is 0.03 μm thick. The rear surface 1a of the wafer 1 after this step becomes a concave form in the same way, and the warp T is 2 mm to a dozen millimeters or so in the case of a six inch wafer. Also, the rear surface 1a of the wafer 1 is protected by the ultraviolet peelable tape 8. At this stage, the emitter electrode 56 is configured of the aluminum-silicon film 3, nickel film 9, and gold film 10. Consequently, the topmost metal film of the surface structure 61 is the gold film 10.

Figure 7:
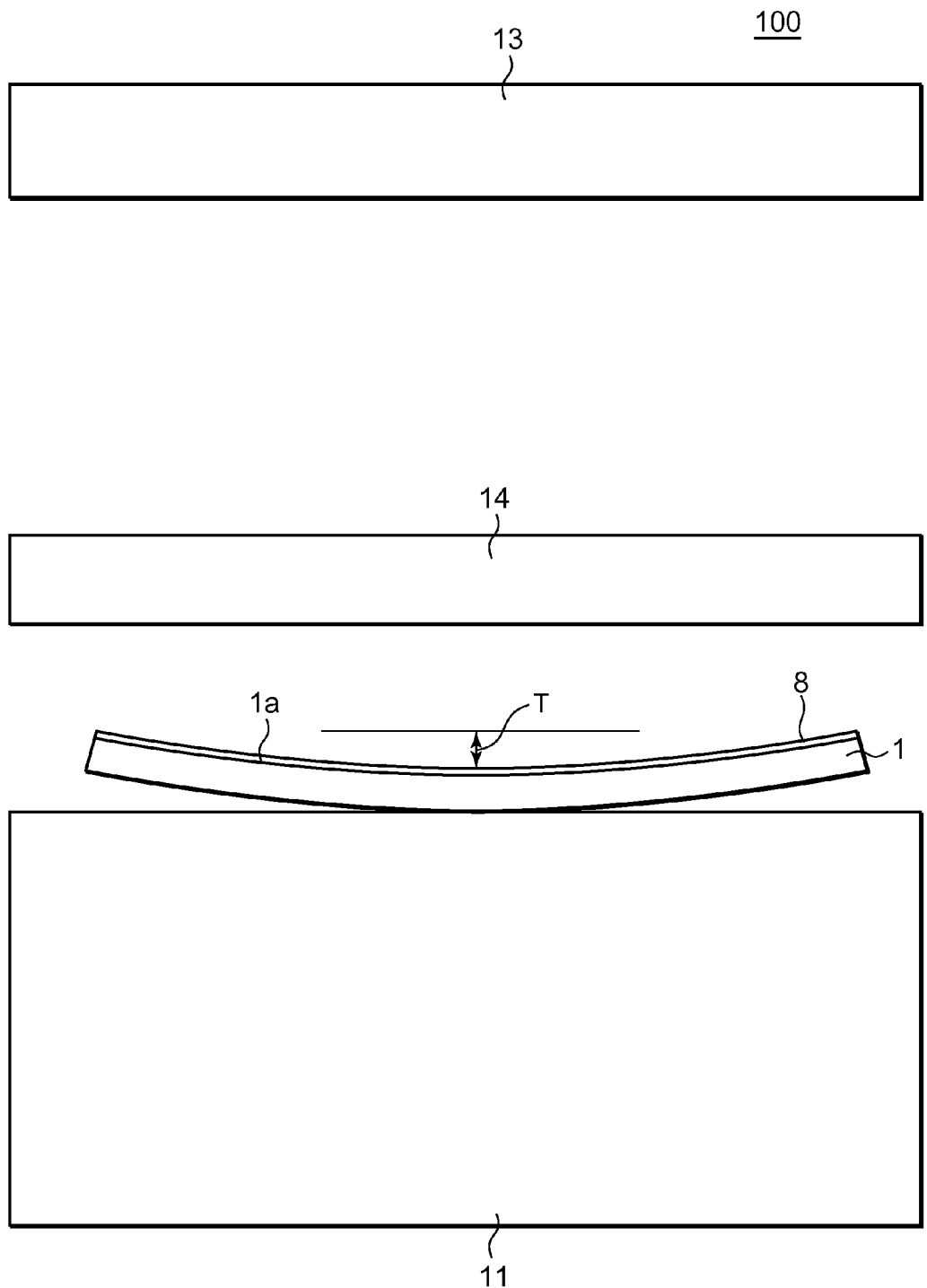
FIG. 7 is a main portion manufacturing step sectional view, following FIG. 6, of the semiconductor device of the first working example of the invention.

Next, in order to peel off the ultraviolet peelable tape 8, the wafer 1 to which the ultraviolet peelable tape 8 is attached is placed on an ultraviolet irradiation apparatus 100. In the example, the wafer 1 is placed on a support 11 of the ultraviolet irradiation apparatus 100 with the surface structure 61 (gold film 10) of the wafer 1 downward (FIG. 7). Herein, although the illustration of the surface structure 61 (gold film 10) is omitted, the wafer 1 is placed in such a way that a surface of the wafer 1 on the side opposite to the surface to which the ultraviolet peelable tape 8 is attached to and/or makes contact with the support 11.

Next, the support 11 is moved up. As an ultraviolet transmitting plate 14 is disposed in a position opposed to the support 11, the outer peripheral portion of the wafer 1 rear surface 1a to which the ultraviolet peelable tape 8 is attached to and/or makes contact with the ultraviolet transmitting plate 14. The warp T of the wafer 1 is corrected by further moving up the support 11 and bringing the support 11 and ultraviolet transmitting plate 14 closer in distance (FIG. 8). Also, strength (a thickness) of such an extent that it is possible to correct the warp of the wafer 1 may be provided in the ultraviolet transmitting plate 14 so that the ultraviolet transmitting plate 14 will not bend even by the warped wafer being pressed against it. Thus, the ultraviolet transmitting plate 14 may have an appropriate thickness and/or strength so that the ultraviolet transmitting plate 14 may not bend significantly even when the warped wafer 1 is pressed against it. When the ultraviolet transmitting plate 14 is a silica glass plate, the thickness thereof is made, for example, about 1.5 mm or more.

In FIG. 8, when the support 11 is moved up and brought into close contact with the ultraviolet transmitting plate 14 in such a way that the wafer 1 is completely flattened, the ultraviolet peelable tape is strongly brought into close contact with the wafer 1, which is not desirable because an adhesive of the ultraviolet peelable tape 8 may remain on the wafer 1 at a peeling stage. For this reason, it is good to configure in such a way that a warp T of 1 mm. to 5 mm, preferably 1 mm to 2 mm or less, is left in the wafer 1 even after the correction so that the wafer 1 does not completely make close contact with the ultraviolet transmitting plate 14.

Figure 9:
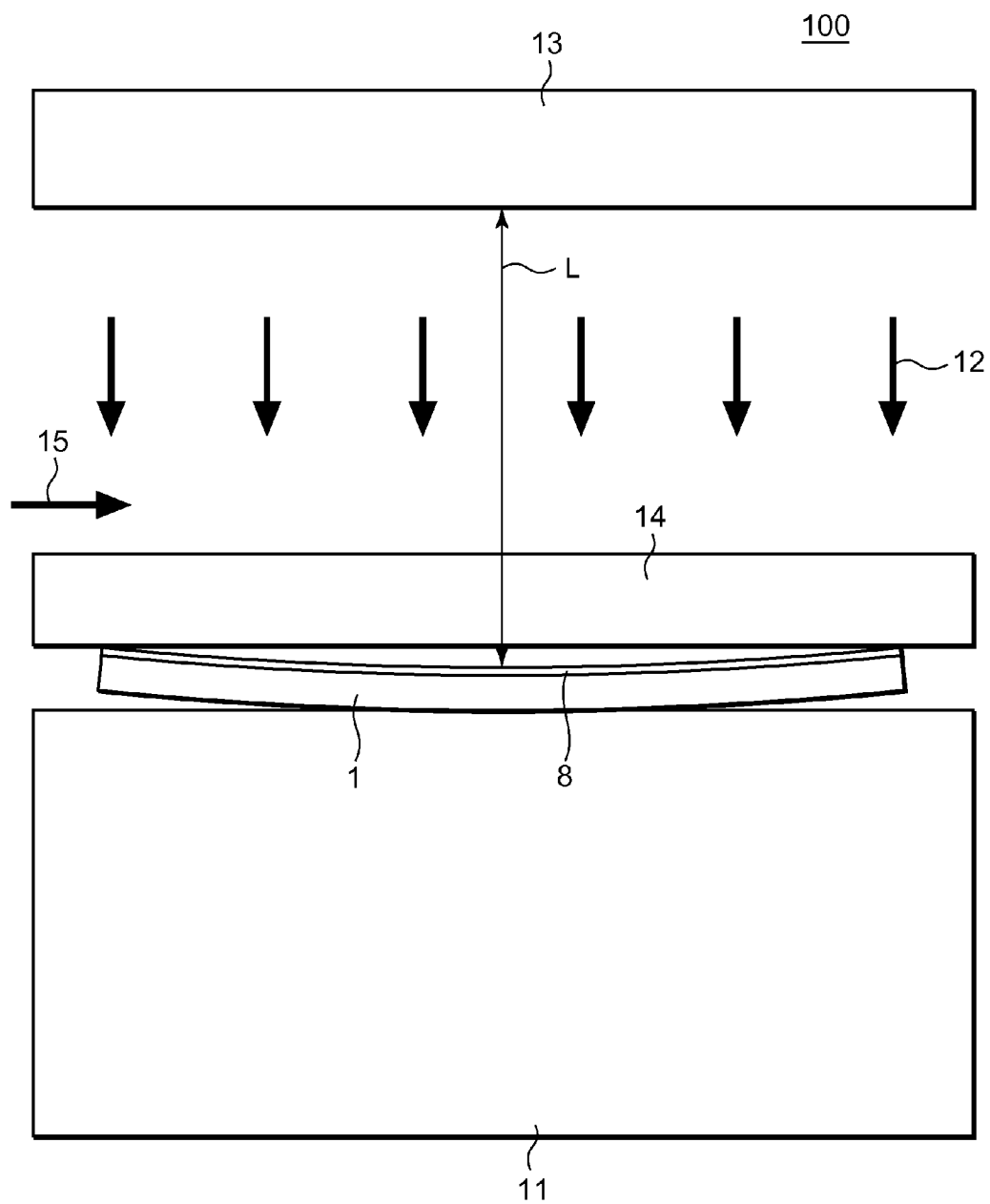
FIG. 9 is a main portion manufacturing step sectional view, following FIG. 8, of the semiconductor device of the first working example of the invention.

Next, the ultraviolet peelable tape 8 is irradiated with ultraviolet light from an ultraviolet light source 13 disposed on the side opposite to the surface of the ultraviolet transmitting plate 14 in contact with the wafer 1 (FIG. 9). Ultraviolet light 12 emitted from the ultraviolet light source 13 is transmitted through the ultraviolet transmitting plate, and the ultraviolet peelable tape 8 attached to the wafer rear surface 1a is irradiated with the ultraviolet light 12.

By the warp T of the wafer 1 being corrected, the ultraviolet peelable tape 8 is approximately uniformly irradiated with the ultraviolet light 12.

The ultraviolet transmitting plate 14 has a function of blocking convective heat from the ultraviolet light source 13. Also, when a rise in temperature of the wafer 1 is high, it is good to cause air 15 to flow and cool the ultraviolet transmitting plate 14.

By correcting the warp of the wafer 1 with the ultraviolet transmitting plate 14 and blocking the heat from the ultraviolet light source 13 in this way, it is possible to reduce a distance L between the ultraviolet light source 13 and wafer 1 while preventing the rise in temperature of the wafer 1. As a result of this, it is possible to implement the ultraviolet irradiation appropriate for peeling approximately uniformly, efficiently, and in a short time. When the distance L between the ultraviolet light source 13 and wafer 1 is in the order of 20 mm, in the event that the warp T of the wafer 1 can be corrected to on the order of several millimeters, it is possible to effectively peel the ultraviolet peelable tape 8 from the wafer 1 in a condition in which the ultraviolet light 12 is irradiated for a short time and there is no adhesive residue.

Figure 10:
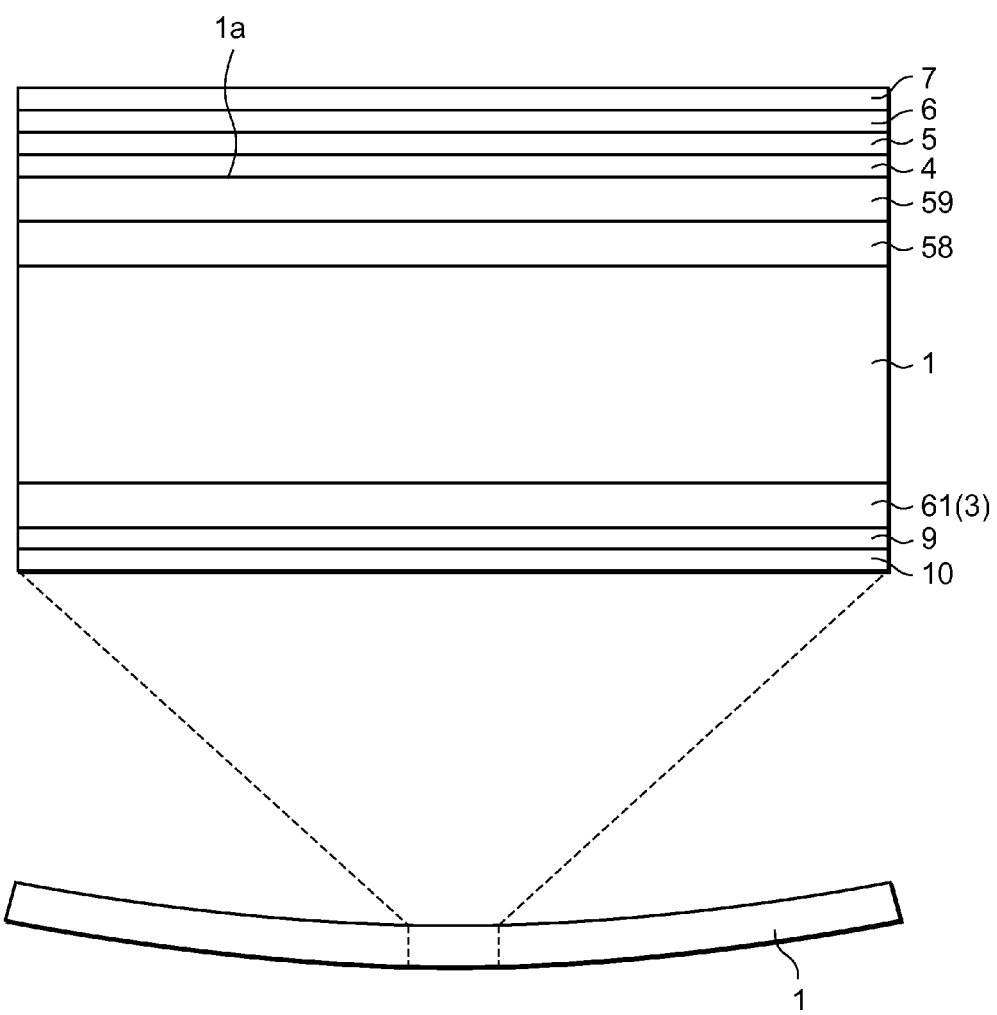
FIG. 10 is a main portion manufacturing step sectional view, following FIG. 9, of the semiconductor device of the first working example of the invention.

Next, the ultraviolet peelable tape 8 in close contact with the rear surface 1a of the wafer 1 is peeled off (FIG. 10).

Figure 11:
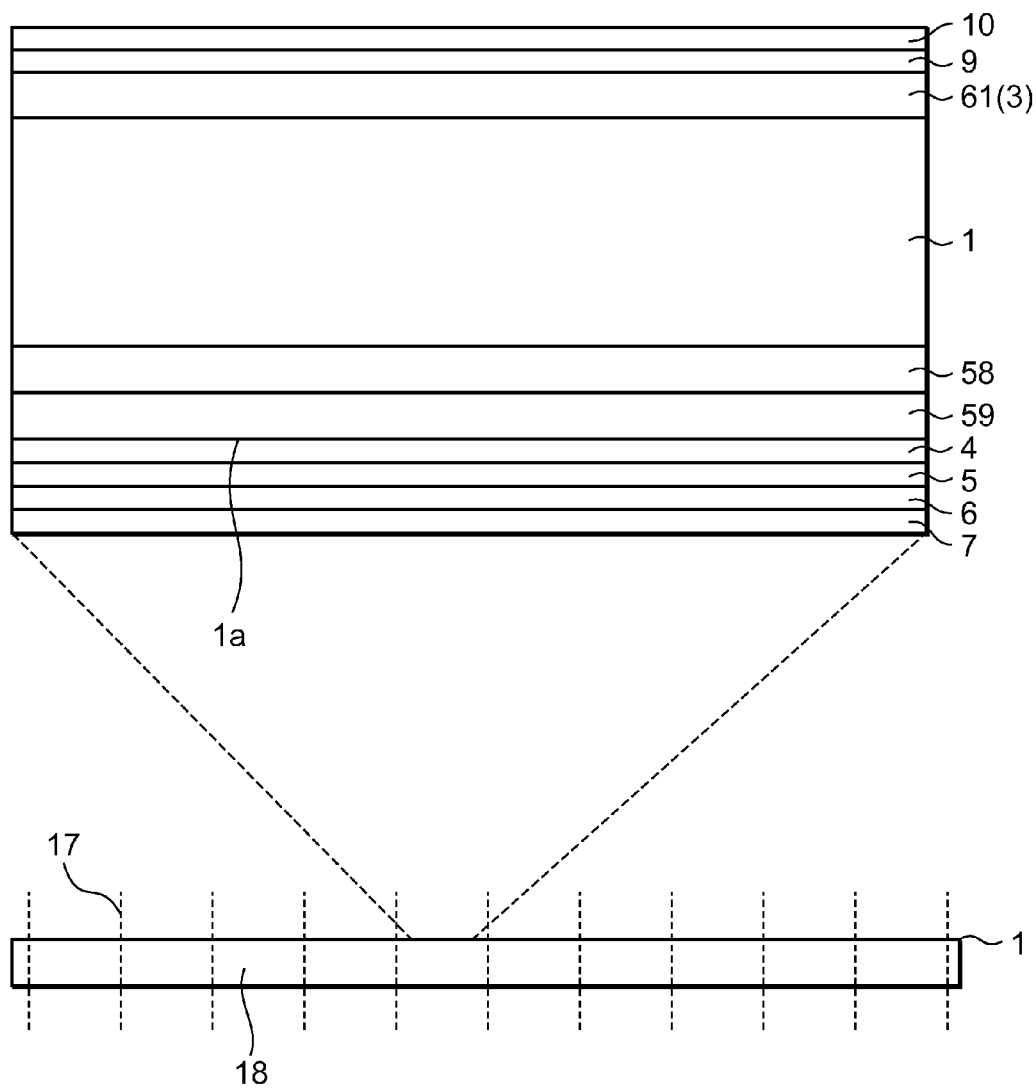
FIG. 11 is a main portion manufacturing step sectional view, following FIG. 10, of the semiconductor device of the first working example of the invention.

Subsequently, the wafer 1 is cut along dicing lines 17 with the rear surface 1a of the wafer 1 downward, forming chips 18 (FIG. 11).

Figure 12:
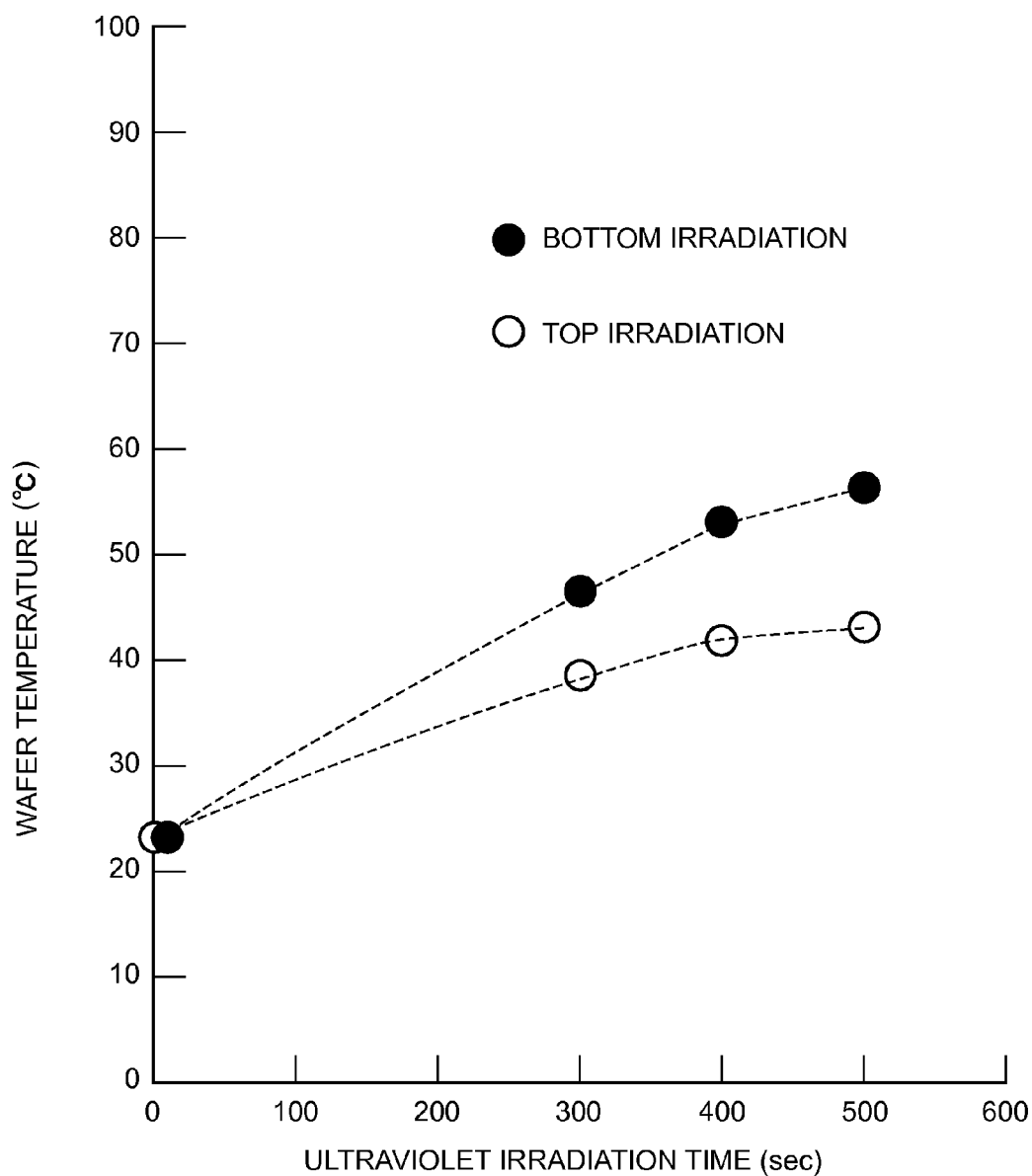
FIG. 12 is a diagram showing a relationship between a wafer temperature and irradiation time when using a fluorescent tube type black light as an ultraviolet light source.

FIG. 12 is a diagram showing a relationship between a wafer temperature and irradiation time when using a fluorescent tube type black light as the ultraviolet light source. Data in the case of a bottom irradiation wherein the ultraviolet light source 13 is disposed below the wafer 1, and the ultraviolet peelable tape 8 is irradiated with the ultraviolet light 12 (no disposition diagram of each portion corresponding to FIG. 9 is shown), and data in the case of a top irradiation wherein the ultraviolet light source 13 is disposed above the wafer 1, and the ultraviolet peelable tape 8 is irradiated with the ultraviolet light 12 (in the case of FIG. 9), are plotted. In either case, a silica glass plate with a thickness of the order of 1.5 mm to 2 mm, which is the ultraviolet transmitting plate 14, is disposed between the ultraviolet light source 13 and wafer 1, thus preventing the heat from the ultraviolet light source 13 being transferred to the wafer 1. Also, the distance L between the ultraviolet light source 13 and wafer 1 is made 20 mm in either case. The fluorescent tube type black light is such that the peak wavelength of the ultraviolet light is 365 nm, and the ultraviolet illuminance when L is 20 mm is 3 mW/cm$^2$. The distance L being a distance from the ultraviolet light source 13 to a place in which the wafer 1 is farthest away therefrom, it is a distance from the bottom of the depressed portion of the wafer 1 to the ultraviolet light source 13. Also, the maximum distance (corresponding to the warp T of FIG. 8) between the ultraviolet transmitting plate 14 and wafer 1 is 2 mm or less.

According to FIG. 12, as the convective heat transfer from the fluorescent tube type black light (ultraviolet light source 13) can be suppressed with the top irradiation, it is good because the rise in temperature of the wafer 1 can be kept down to 50° C. or less.

Also, in the case of the bottom irradiation too, as the ultraviolet transmitting plate 14 blocks the heat although the temperature of the wafer 1 rises higher than with the top irradiation, it is good because the rise in temperature of the wafer 1 can be kept down to 60° C. or less, which is lower than the resistible temperature 80° C. of the ultraviolet peelable tape. In the case of the bottom irradiation, as the heat from the fluorescent tube type black light (ultraviolet light source 13), which is a heat generation source, moves upward by convection, and warms the ultraviolet transmitting plate 14, the temperature of the wafer 1 rises higher than in the case of the top irradiation.

As heretofore described, by configuring in such a way that the wafer 1 is corrected as flatly as possible by the ultraviolet transmitting plate 14, and uniformly irradiated with the ultraviolet light 12, it is possible to reduce the ultraviolet irradiation time appropriate for peeling off the ultraviolet peelable tape 8.

In the above way, it is possible to peel the ultraviolet peelable tape from the wafer effectively (in the condition in which there is no adhesive residue) with a short duration of ultraviolet irradiation while suppressing the rise in temperature of the wafer. Because of this, a wafer throughput is improved, and a poor appearance is also prevented from occurring.

The invention can also be applied to a semiconductor device using a semiconductor wafer of SiC, GaN, or the like, other than silicon. Also, in Working Example 1, a description has been given with a planar FS IGBT as an example of the semiconductor device. However, it goes without saying that the invention can also be applied to a semiconductor device manufactured using a thin wafer for a trench FS IGBT, a non punch through (NPT) IGBT, a power MOSFET, or the like.

Also, in the heretofore described example, the wafer 1 is placed on the support 11 and, by moving up the support 11, the wafer 1 is pressed against the ultraviolet transmitting plate 14, but it is sufficient that the support 11 and ultraviolet transmitting plate 14 move relative to each other, and the ultraviolet transmitting plate may be movable.

Also, a configuration may be such that the support 11 is configured of the ultraviolet transmitting plate, and the ultraviolet peelable tape side of the wafer 1 is placed thereon, and irradiated with ultraviolet light from below the support (ultraviolet transmitting plate). At this time, it is sufficient that a pressing member is disposed opposed to the support 11 acting as the ultraviolet transmitting plate. Strength (a thickness) of such an extent that it is possible to correct the warp of the wafer 1 may be provided in the pressing member so that the pressing member will not bend even by the warped wafer 1 being pressed against it.

WORKING EXAMPLE 2

Figure 13:
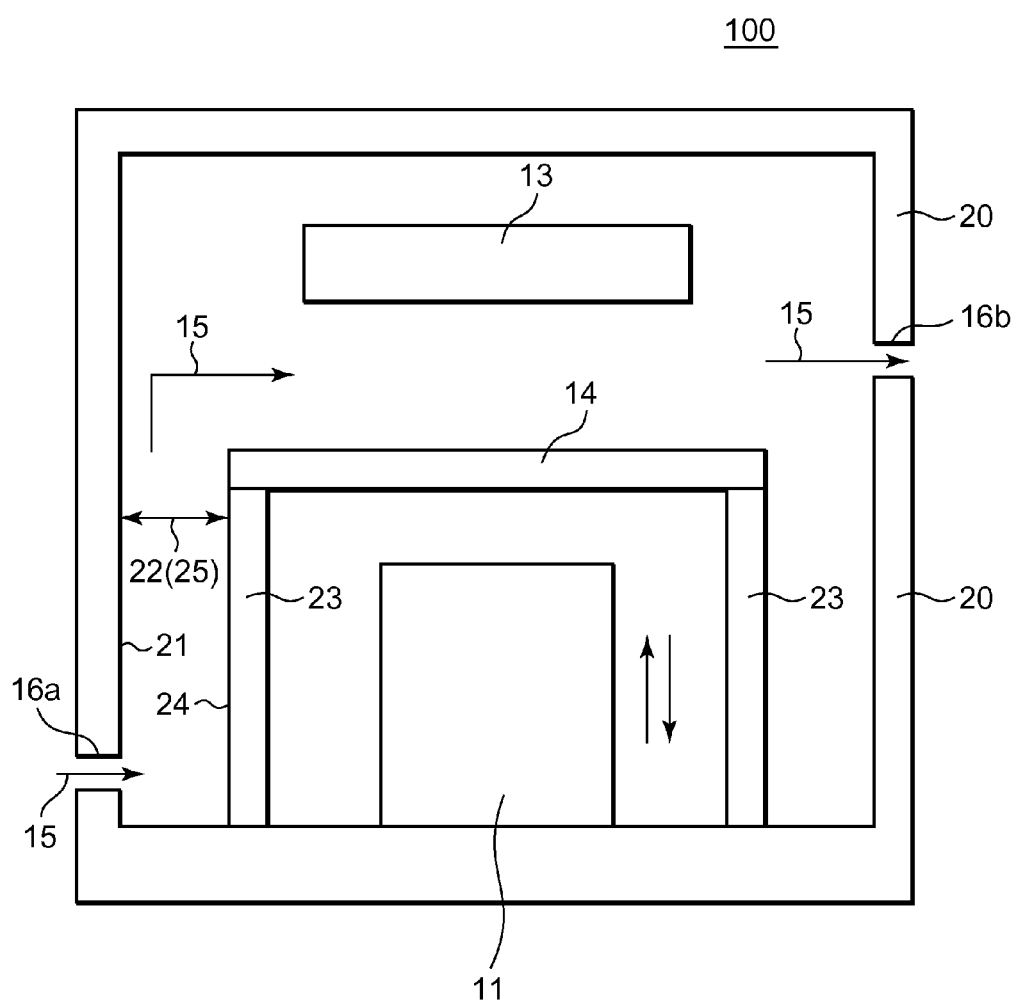
FIG. 13, being a second working example of the invention, is a main portion configuration diagram of a semiconductor device manufacturing apparatus.
Figure 14:
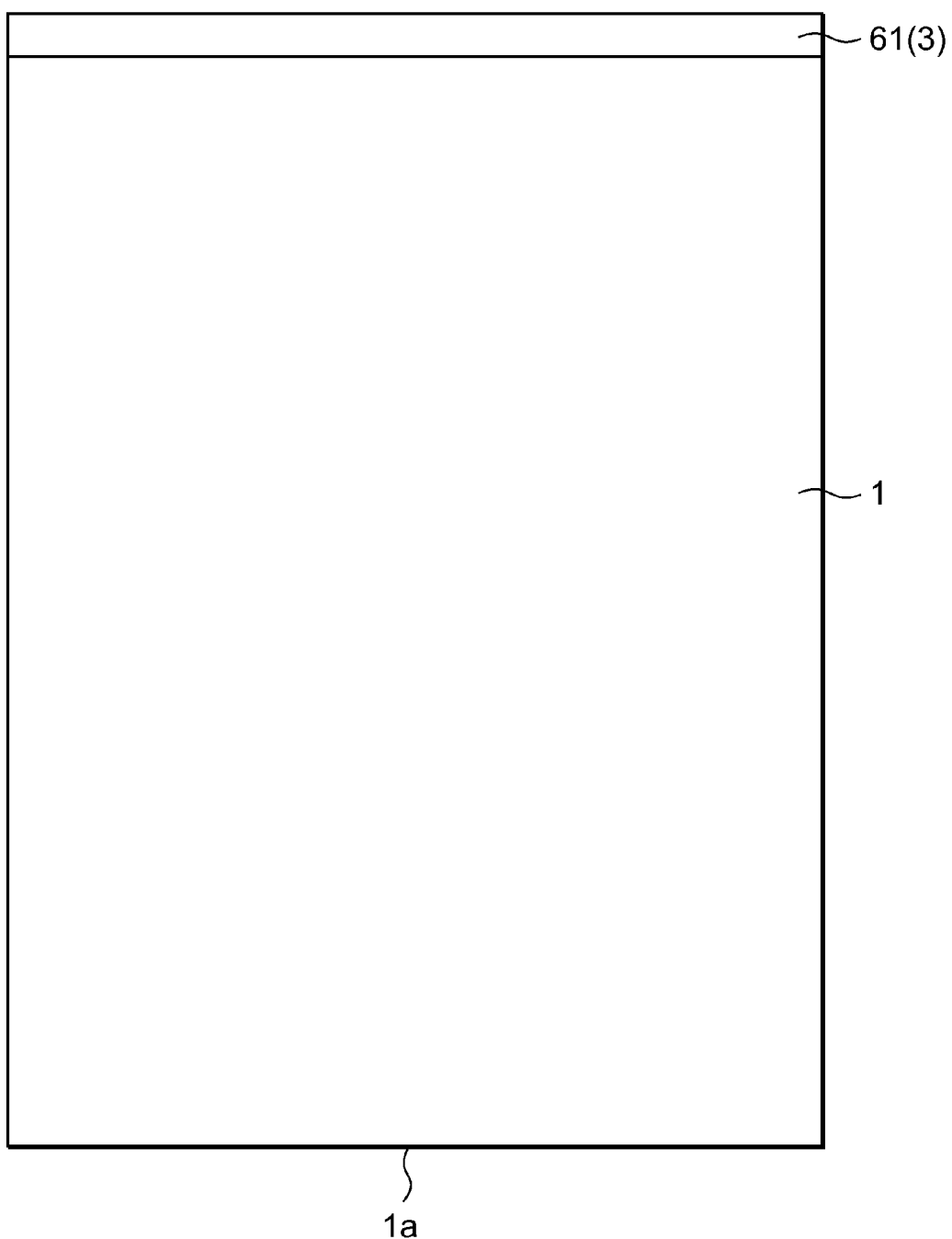
FIG. 14 is a main portion manufacturing step sectional view of a heretofore known semiconductor device.
Figure 15:
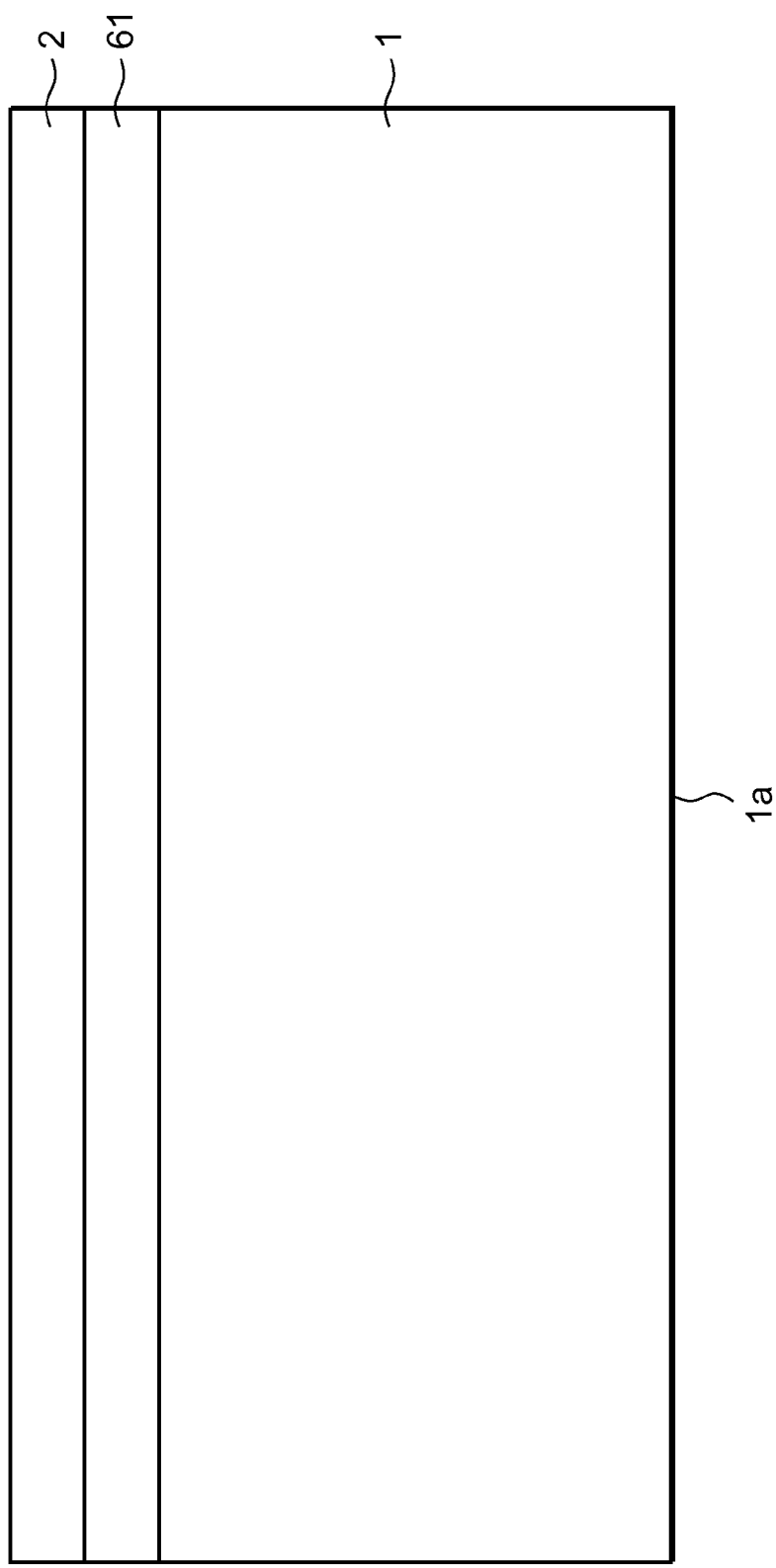
FIG. 15 is a main portion manufacturing step sectional view, following FIG. 14, of the heretofore known semiconductor device.
Figure 16:
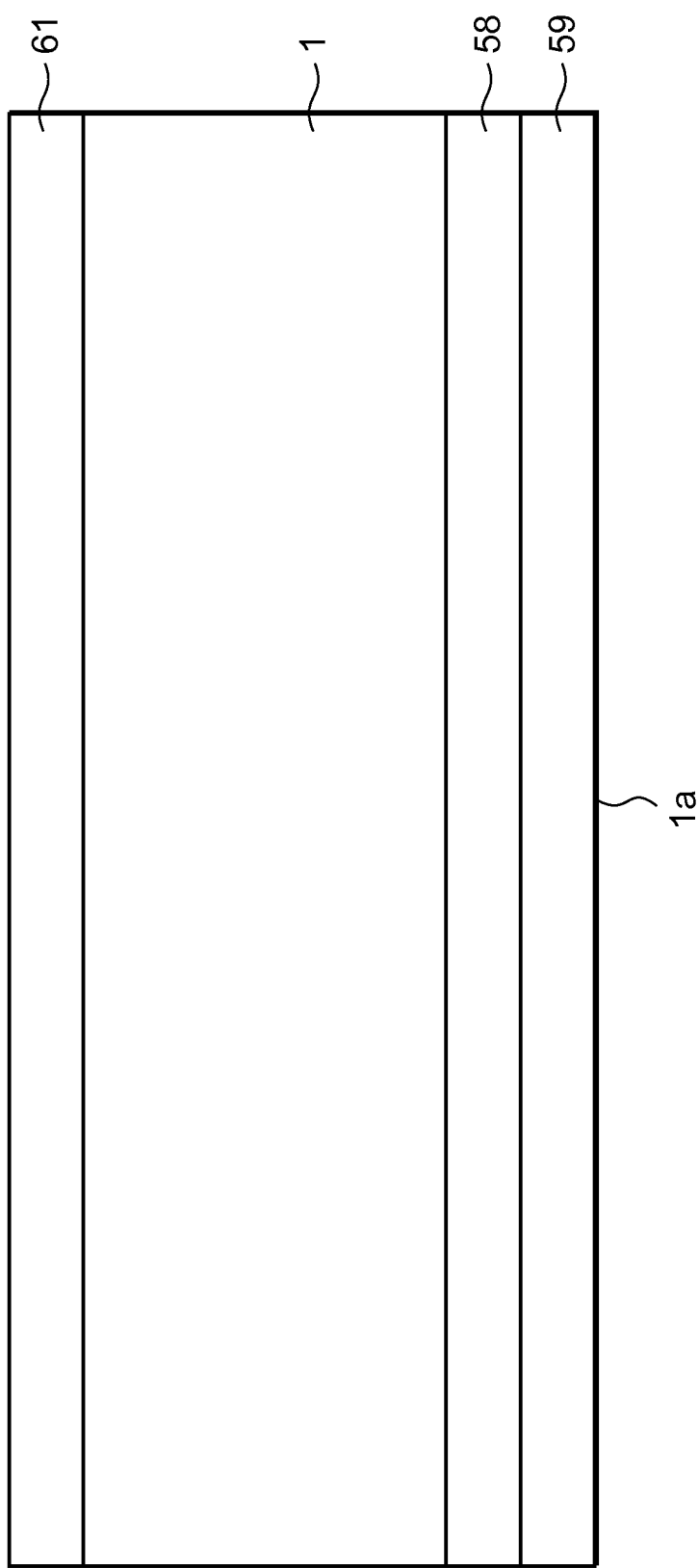
FIG. 16 is a main portion manufacturing step sectional view, following FIG. 15, of the heretofore known semiconductor device.
Figure 17:
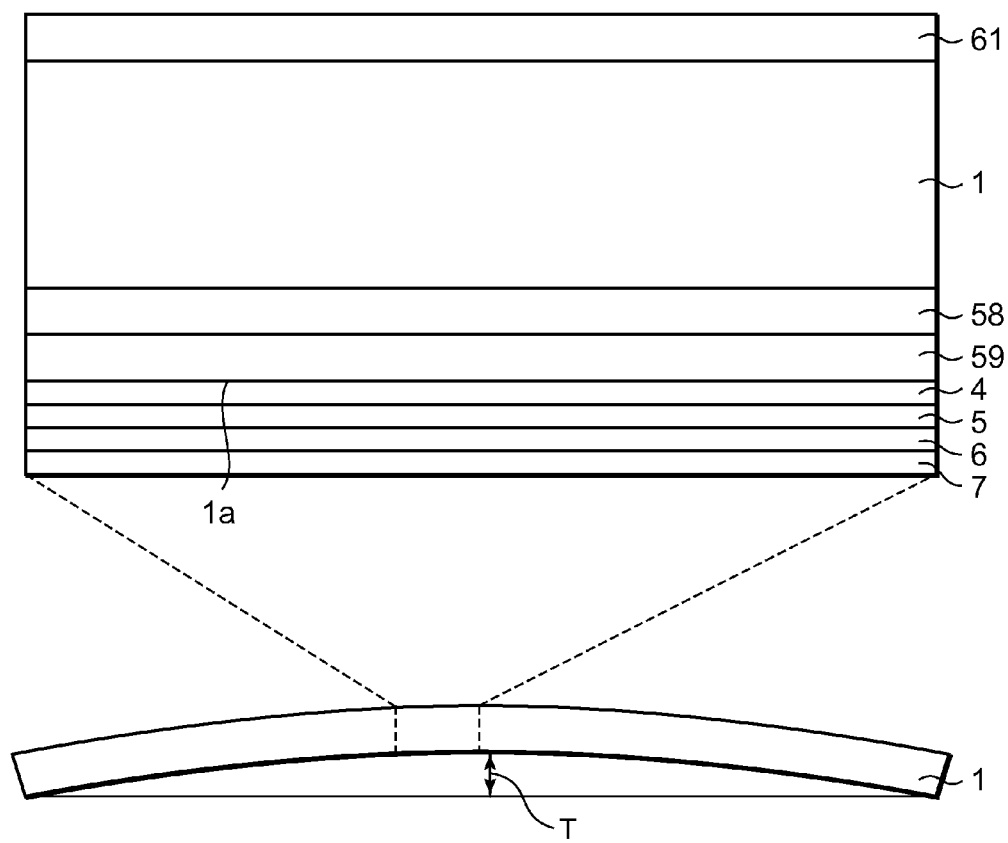
FIG. 17 is a main portion manufacturing step sectional view, following FIG. 16, of the heretofore known semiconductor device.
Figure 18:
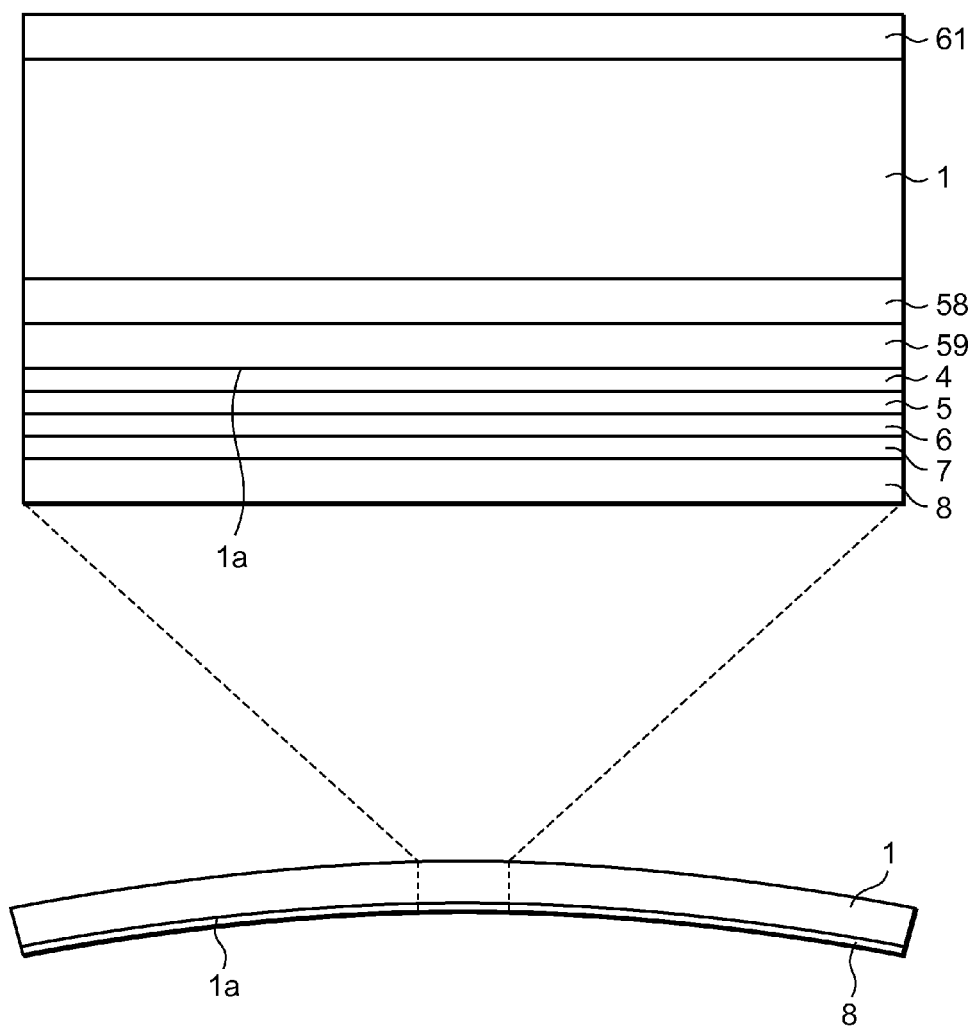
FIG. 18 is a main portion manufacturing step sectional view, following FIG. 17, of the heretofore known semiconductor device.
Figure 19:
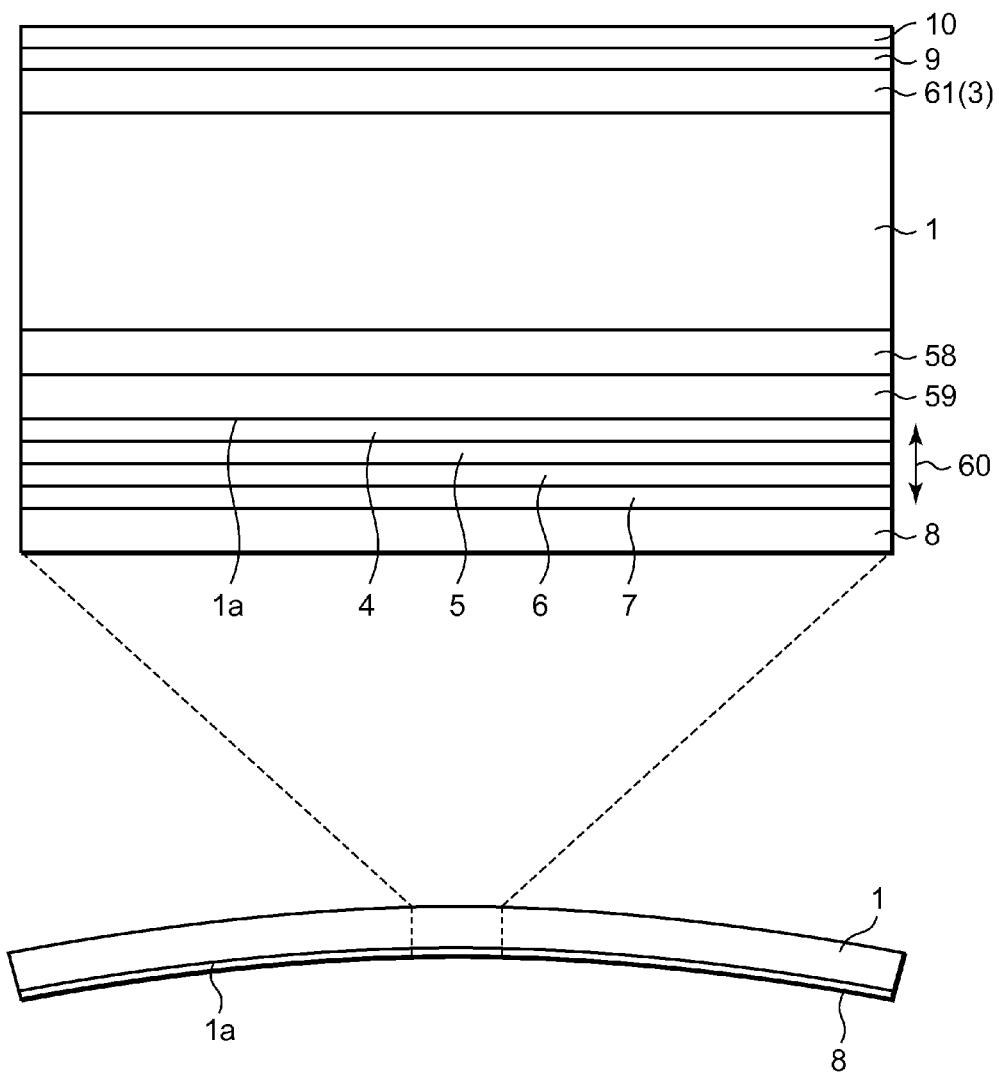
FIG. 19 is a main portion manufacturing step sectional view, following FIG. 18, of the heretofore known semiconductor device.
Figure 20:
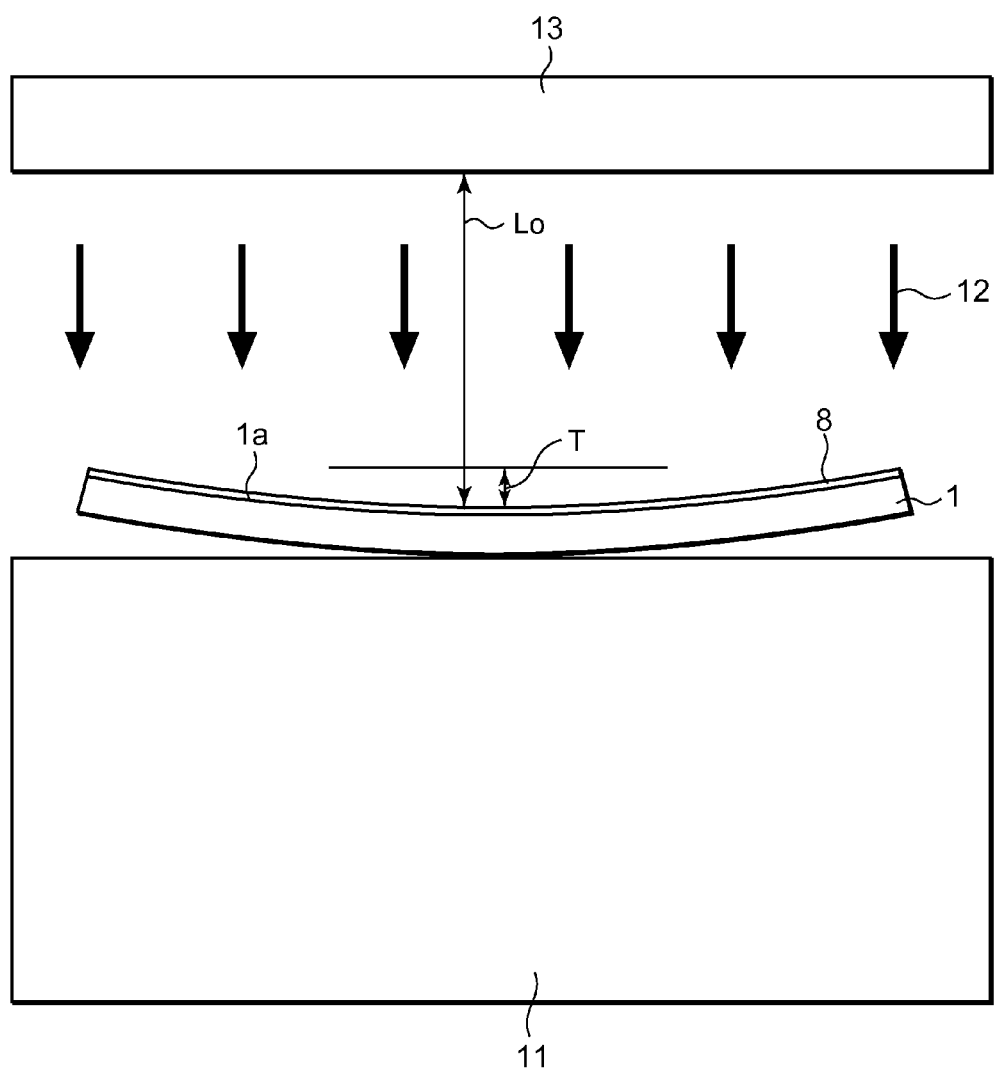
FIG. 20 is a main portion manufacturing step sectional view, following FIG. 19, of the heretofore known semiconductor device.
Figure 21:
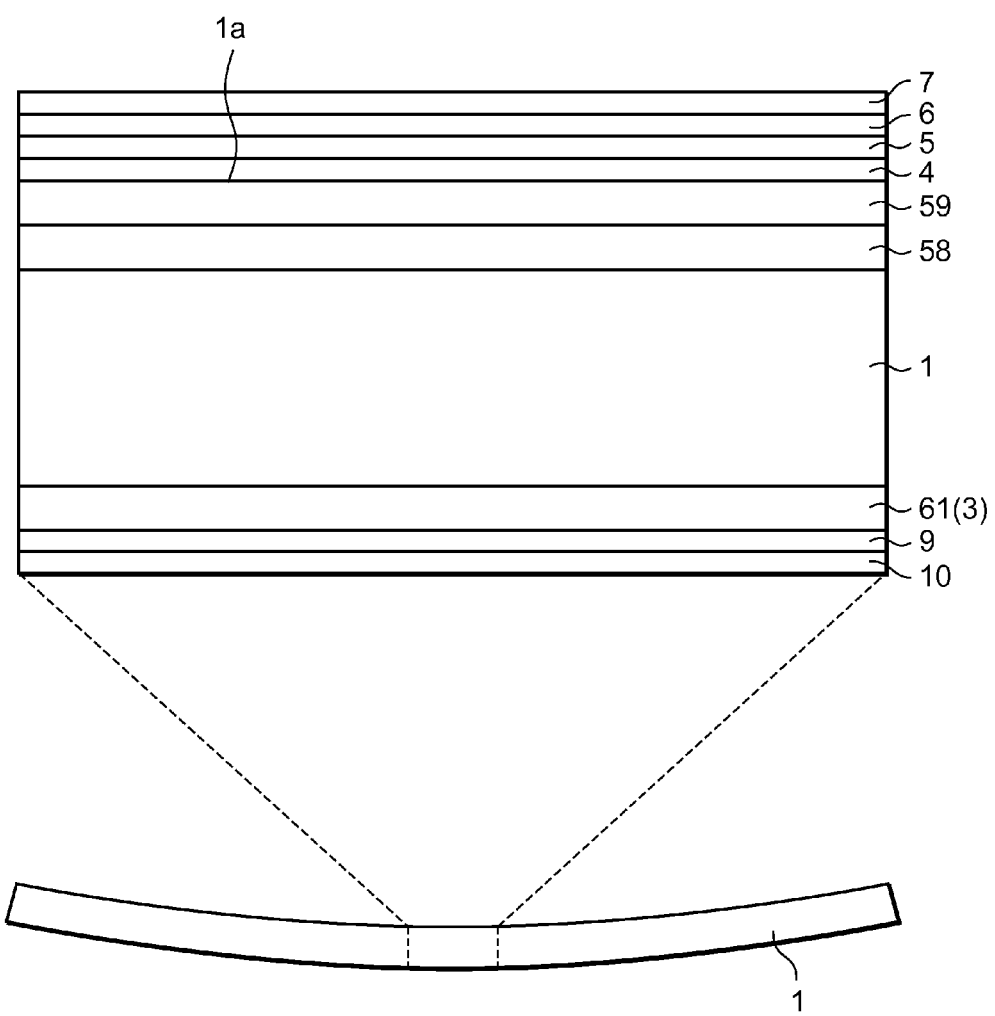
FIG. 21 is a main portion manufacturing step sectional view, following FIG. 20, of the heretofore known semiconductor device.
Figure 22:
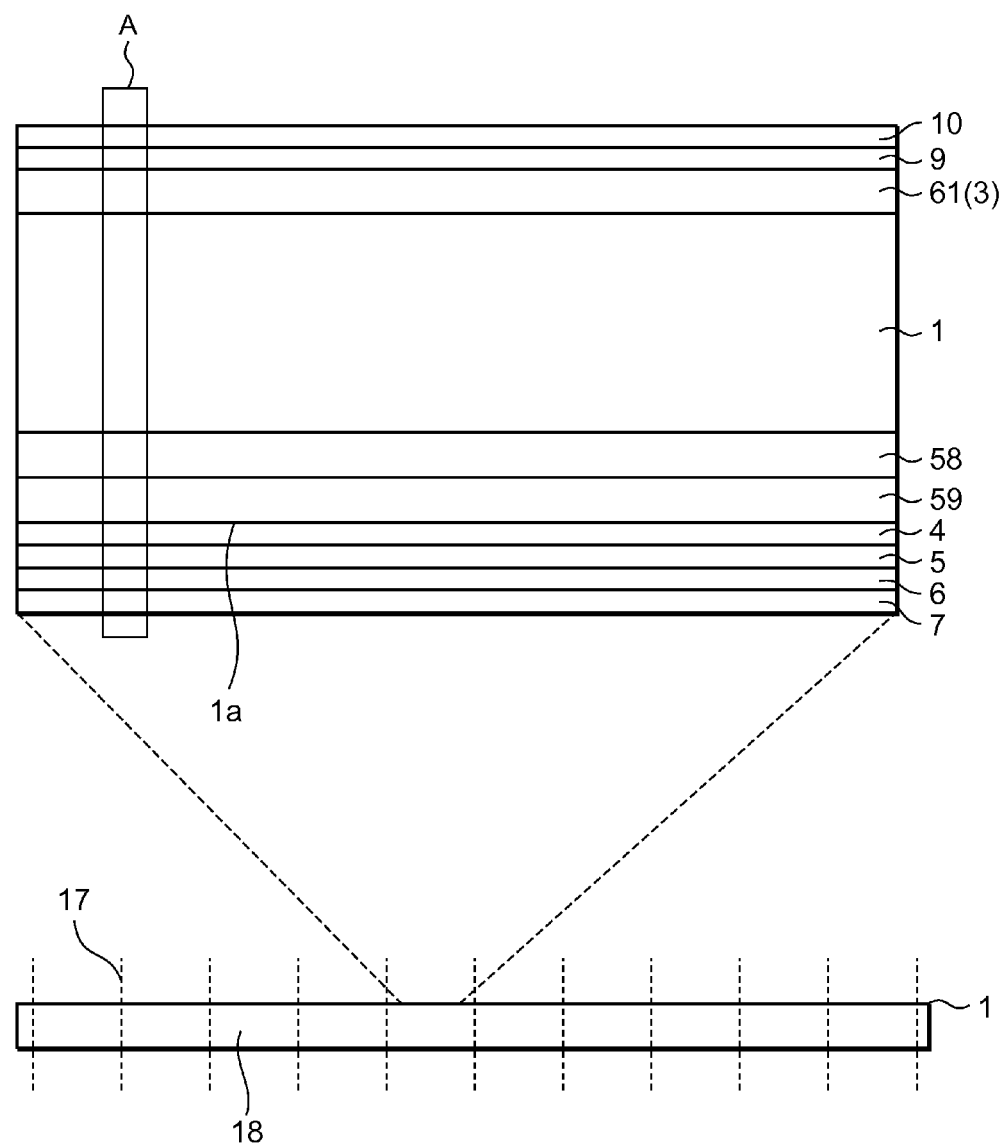
FIG. 22 is a main portion manufacturing step sectional view, following FIG. 21, of the heretofore known semiconductor device.
Figure 23:
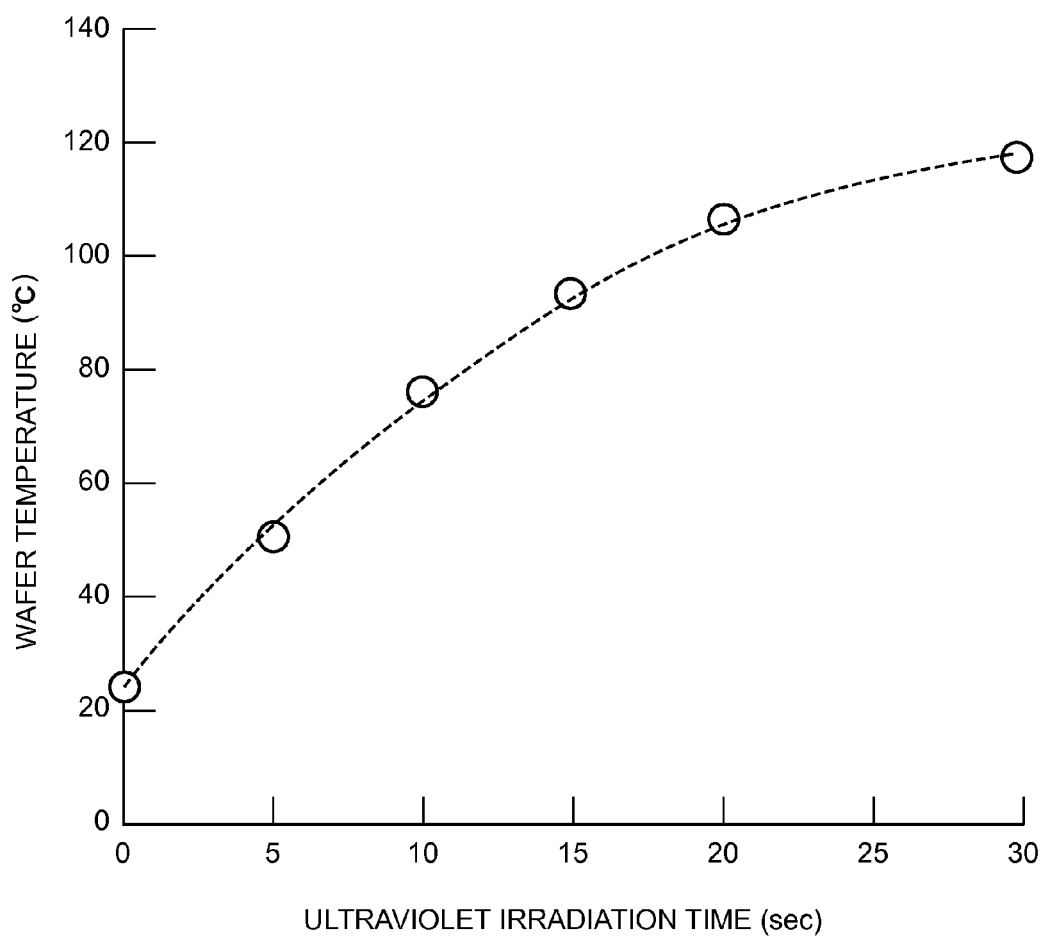
FIG. 23 is a diagram showing the dependence of a wafer temperature on an irradiation time when using a metal halide lamp.

FIG. 13 is a main portion configuration diagram of a semiconductor device manufacturing apparatus of a second working example of the invention. The manufacturing apparatus is an ultraviolet irradiation apparatus 100 suitable for peeling off an ultraviolet peelable tape 8 attached to a wafer 1. The ultraviolet irradiation apparatus 100 shown here is an example of a top irradiation type.

The ultraviolet irradiation apparatus 100 is configured of a support 11 which is movable up and down, and on which the wafer 1 is placed, an ultraviolet transmitting plate 14 disposed on the support 11, and an ultraviolet light source 13 which, being disposed on the ultraviolet transmitting plate 14, irradiates the ultraviolet peelable tape 8 attached to the wafer 1 with ultraviolet light 12.

Strength (a thickness) of such an extent that it is possible to correct a warp of the wafer 1 may be provided in the support 11 so that the support 11 will not bend even by the warped wafer 1 being pressed against it. Also, the support 11, as it makes contact with an unshown wafer 1 surface structure 61, is configured of a member of a material which does not contaminate, and is unlikely to make a scratch or the like on, the surface structure 61. For example, a member coated with fluorine resin, polyimide, or the like, is suitable.

Also, in the heretofore described example, the configuration is such that the wafer 1 is placed on the support 11, and the support 11 is movable up and down, but it is sufficient that the support 11 and ultraviolet transmitting plate 14 move relative to each other, and the ultraviolet transmitting plate may be movable.

Also, the ultraviolet irradiation apparatus 100 is configured of a housing box 20 which houses the support 11, ultraviolet transmitting plate 14, and ultraviolet light source 13, and an air flow passageway 22 which causes air 15 to flow along an inner wall 21 of the housing box 20. The air flow passageway 22 is a space 25 sandwiched by the inner wall 21 of the housing box 20, an outer wall 24 of an isolation wall 23 supporting the ultraviolet transmitting plate 14, and the ultraviolet transmitting plate 14. The air flow passageway 22 has a function of causing the air 15 taken in from an entrance 16a of the space 25 to flow toward an exit 16b, thereby cooling the ultraviolet transmitting plate 14 heated by the ultraviolet light source 13, and suppressing the rise in temperature of the wafer 1 in contact with the ultraviolet transmitting plate 14. Also, the ultraviolet transmitting plate 14 also has a function of blocking convective heat from the ultraviolet light source 13. Also, as there is no need to provide the air flow passageway 22 when the rise in temperature of the wafer 1 is low, it eliminates the need for the isolation wall 23, and the ultraviolet transmitting plate 14 is fixed to the housing box 20.

When an unshown infrared cut filter is provided above or below the ultraviolet transmitting plate 14, it is preferable because the rise in temperature of the wafer 1 is suppressed. Naturally, when a plate having an infrared cut filtering function is used as the ultraviolet transmitting plate 14, it is good because the ultraviolet irradiation apparatus 100 is not increased in size.

Also, it is possible to suppress the rise in temperature of the wafer 1 by water-cooling the support 11.

Also, it is good that a heat-resistant glass plate which transmits the ultraviolet light 12 is used as the ultraviolet transmitting plate 14. Strength (a thickness) of such an extent that it is possible to correct the warp of the wafer 1 may be provided in the ultraviolet transmitting plate 14 so that the ultraviolet transmitting plate 14 will not bend by the warped wafer 1 being pressed against it. When the ultraviolet transmitting plate 14 is a silica glass plate, the thickness thereof is made, for example, about 1.5 mm or more.

A heat-resistant glass which transmits the ultraviolet light can be applied to the ultraviolet transmitting plate 14. Not only the previously mentioned silica glass plate, but various kinds of heat-resistant glass are widely used as the heat-resistant glass, and they are stable in quality, and easily available.

Also, as the ultraviolet light source 13, apart from a fluorescent tube type black light, there are a mercury lamp, a metal halide lamp, an ultraviolet light emitting diode (UV-LED), and the like. However, for example, when a metal halide lamp is used, it may be appropriate to take measures to suppress the rise in temperature of the wafer 1, such as by increasing the distance between the metal halide lamp and wafer 1.

As the ultraviolet irradiation apparatus 100, the case of the top irradiation type has been shown, but although not shown in the drawing, there is also a case of a bottom irradiation type. In this case, as the ultraviolet irradiation apparatus, the configuration is such that the ultraviolet transmitting plate 14 is disposed above the ultraviolet light source 13, the wafer 1 is disposed in such a way that the ultraviolet peelable tape 8 attached to the wafer 1 makes contact with the ultraviolet transmitting plate 14, and a pressing member is disposed in such away as to make contact with the wafer 1. As the pressing member, in the same way as with the support in the example of the top irradiation type, it is sufficient that a member having strength (a thickness) of such an extent that it is possible to correct the warp of the wafer 1 is used so that the member will not bend even by the warped wafer 1 being pressed against it.

The invention is such that the warped wafer is clamped between the ultraviolet transmitting plate on the side of a surface of the wafer to which the ultraviolet peelable tape is attached, and the pressing member on the other surface side, and the ultraviolet transmitting plate and pressing member are moved relative to each other, thereby correcting the warp of the wafer, after which the ultraviolet light is transmitted through the ultraviolet transmitting plate, and the ultraviolet peelable tape is irradiated with the ultraviolet light. Consequently, the invention is not limited to the configuration wherein the ultraviolet peelable tape is irradiated with the ultraviolet light from the top or the bottom, as heretofore described, but, for example, a configuration may be such that the wafer is clamped between the ultraviolet transmitting plate and pressing member from left and right directions.

What is claimed is:

1. A semiconductor device manufacturing method comprising:
   providing a semiconductor wafer;
   attaching an ultraviolet peelable tape to a first surface of the semiconductor wafer;
   abutting an ultraviolet transmitting plate against the first surface of the semiconductor wafer to which the ultraviolet peelable tape is attached;
   abutting a pressing member against a second surface of the semiconductor wafer;
   clamping the semiconductor wafer between the ultraviolet transmitting plate and the pressing member;
   transmitting ultraviolet light through the ultraviolet transmitting plate and irradiating the ultraviolet peelable tape with the ultraviolet light that was transmitted through the ultraviolet transmitting plate; and
   peeling the ultraviolet peelable tape from the semiconductor wafer.

2. The semiconductor device manufacturing method according to claim 1, wherein clamping the semiconductor wafer between the ultraviolet transmitting plate and the pressing member includes:
   placing the semiconductor wafer on one of the ultraviolet transmitting plate and the pressing member; and
   clamping the semiconductor wafer by moving the ultraviolet transmitting plate and pressing member relative to each other.

3. The semiconductor device manufacturing method according to claim 1, wherein clamping the semiconductor wafer between the ultraviolet transmitting plate and the pressing member includes correcting a warp of the semiconductor wafer by clamping the semiconductor wafer between the ultraviolet transmitting plate and the pressing member.

4. The semiconductor device manufacturing method according to claim 1, wherein the thickness of the semiconductor wafer is between about 80 μm and about 140 μm.

5. The semiconductor device manufacturing method according to claim 1, wherein irradiating the ultraviolet peelable tape with the ultraviolet light includes irradiating the ultraviolet peelable tape with about 1000 mJ/cm$^2$ or more of ultraviolet light.

6. The semiconductor device manufacturing method according to claim 1, wherein the ultraviolet peelable tape is peeled from the semiconductor wafer after the ultraviolet peelable tape is irradiated with the ultraviolet light that was transmitted through the ultraviolet transmitting plate.

7. The semiconductor device manufacturing method according to claim 1, wherein an air flow cools the ultraviolet transmitting plate.

\* \* \* \* \*